United States Patent
Endoh

(10) Patent No.: US 10,079,297 B2
(45) Date of Patent: Sep. 18, 2018

(54) COMPOUND SEMICONDUCTOR DEVICE

(71) Applicant: FUJITSU LIMITED, Kawasaki-shi, Kanagawa (JP)

(72) Inventor: Akira Endoh, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/452,999

(22) Filed: Mar. 8, 2017

(65) Prior Publication Data

US 2017/0263742 A1   Sep. 14, 2017

(30) Foreign Application Priority Data

Mar. 14, 2016  (JP) ................................. 2016-050147

(51) Int. Cl.

| | |
|---|---|
| *H01L 29/06* | (2006.01) |
| *H01L 29/165* | (2006.01) |
| *H01L 29/205* | (2006.01) |
| *H01L 29/423* | (2006.01) |
| *H01L 29/66* | (2006.01) |
| *H01L 29/778* | (2006.01) |

(52) U.S. Cl.
CPC ...... *H01L 29/7786* (2013.01); *H01L 29/0688* (2013.01); *H01L 29/165* (2013.01); *H01L 29/205* (2013.01); *H01L 29/42356* (2013.01); *H01L 29/66462* (2013.01)

(58) Field of Classification Search
None
See application file for complete search history.

(56) References Cited

U.S. PATENT DOCUMENTS

| | | | |
|---|---|---|---|
| 2011/0127540 A1* | 6/2011 | Yamada | H01L 29/0657 257/76 |
| 2015/0187924 A1* | 7/2015 | Dasgupta | H01L 21/30617 257/76 |

FOREIGN PATENT DOCUMENTS

| | | |
|---|---|---|
| JP | 2005-252276 A1 | 9/2005 |
| JP | 2006-005380 A1 | 1/2006 |
| JP | 2009-60043 A1 | 3/2009 |

* cited by examiner

*Primary Examiner* — Jay C Chang
(74) *Attorney, Agent, or Firm* — Kratz, Quintos & Hanson, LLP

(57) ABSTRACT

A compound semiconductor device includes a compound semiconductor layer, a gate electrode disposed above the compound semiconductor layer, and source and drain electrodes disposed above the compound semiconductor layer with the gate electrode between the source and drain electrodes, wherein the compound semiconductor layer has a groove in a surface thereof at least between the source electrode and the gate electrode in a region between the source electrode and the drain electrode, the groove gradually deepened toward the source electrode.

4 Claims, 42 Drawing Sheets

AREA WHERE ELECTRIC
FIELD IS CONCENTRATED

US 10,079,297 B2

COMPOUND SEMICONDUCTOR DEVICE

CROSS-REFERENCE TO RELATED APPLICATION

This application is based upon and claims the benefit of priority of the prior Japanese Patent Application No. 2016-050147, filed on Mar. 14, 2016, the entire contents of which are incorporated herein by reference.

FIELD

The embodiments discussed herein are related to compound semiconductor devices and methods for manufacturing compound semiconductor devices.

BACKGROUND

Recently, high-electron-mobility transistors (HEMTs) have attracted attention as ultrafast transistors for communication applications. HEMTs are transistors capable of operating in the millimeter-wave band (30 to 300 GHz), the submillimeter-wave band (300 GHz to 3 THz), and the terahertz band (0.1 to 10 THz).

The total delay time $\tau_{total}$, which corresponds to the operating speed of HEMTs, is the reciprocal of the cutoff frequency $f_T$ and is expressed as the sum of the intrinsic delay time $\tau_{int}$ and the extrinsic (parasitic) delay time $\tau_{ext}$, as follows:

$$\tau_{total} = 1/(2\pi f_T) = \tau_{int} + \tau_{ext}$$

The intrinsic delay time $\tau_{int}$ is expressed as follows:

$$\tau_{int} = L_g/v$$

where $L_g$ is the gate length, and $v$ is the average channel electron velocity under the gate electrode.

Hence, a decrease in gate length $L_g$ and an increase in channel electron velocity $v$ result in a faster HEMT with reduced intrinsic delay time $\tau_{int}$. An increase in channel electron velocity may be achieved using a semiconductor with a small effective electron mass for the channel. Examples of semiconductors with small effective electron masses include InAs ($0.022m_0$), InSb ($0.014m_0$), and a mixture thereof, namely, InAsSb (where $m_0$ is the electron rest mass).

The extrinsic (parasitic) delay time $\tau_{ext}$ is expressed as follows:

$$\tau_{ext} = \Delta L/v + C_{gd}(R_s + R_d) + \tau_{cc}$$

where $\Delta L$ is the increase in effective gate length due to the increase in the length of the depletion layer, $C_{gd}$ is the gate-to-drain capacitance, $R_s$ ($R_d$) is the source (drain) resistance, and $\tau_{cc}$ is the channel charging time. One effective approach to reducing the extrinsic (parasitic) delay time $\tau_{ext}$ is to decrease the source (drain) resistance $R_s$ ($R_d$).

A typical method for decreasing $R_s$ ($R_d$) is to reduce the source-to-gate distance $L_{sg}$ or the gate-to-drain distance $L_{gd}$. A reduction in gate-to-drain distance $L_{gd}$ affects the electric field intensity between the gate and the drain and the gate-to-drain capacitance $C_{gd}$. In contrast, a reduction in source-to-gate distance $L_{sg}$ allows for a nearly proportional decrease in resistance. Recently, however, the source-to-gate distance $L_{sg}$ has already been significantly reduced, and a method that is more effective than reducing the source-to-gate distance $L_{sg}$ is becoming increasingly desirable.

Another typical method for decreasing $R_s$ ($R_d$) is to reduce the source-to-drain distance $L_{sd}$. Recently, the intrinsic delay time $\tau_{int}$ has been reduced because of technical improvements such as the reduction in gate length $L_g$ and the use of semiconductors with small effective electron masses for the channel, and the extrinsic (parasitic) delay time $\tau_{ext}$ has accounted for a larger proportion of the total delay time $\tau_{total}$. Accordingly, it is desirable to reduce both the intrinsic delay time $\tau_{int}$ and the extrinsic (parasitic) delay time $\tau_{ext}$ to provide a faster HEMT. Recently, however, the source-to-drain distance $L_{sd}$ has also been significantly reduced, and a method that is more effective than reducing the source-to-drain distance $L_{sd}$ is becoming increasingly desirable.

The influence of the parasitic delay time on the delay time has relatively increased due to the reduction in gate length. Accordingly, it is desirable to reduce the extrinsic (parasitic) delay time $\tau_{ext}$ as well as the intrinsic delay time $\tau_{int}$ to provide a faster HEMT. As discussed above, decreasing the source resistance $R_s$ is effective in reducing the extrinsic (parasitic) delay time $\tau_{ext}$.

The followings are reference documents.
[Document 1] Japanese Laid-open Patent Publication No. 2006-5380,
[Document 2] Japanese Laid-open Patent Publication No. 2009-60043, and
[Document 3] Japanese Laid-open Patent Publication No. 2005-252276.

SUMMARY

According to an aspect of the invention, a compound semiconductor device includes: a compound semiconductor layer; a gate electrode disposed above the compound semiconductor layer; and source and drain electrodes disposed above the compound semiconductor layer with the gate electrode between the source and drain electrodes, wherein the compound semiconductor layer has a groove in a surface thereof at least between the source electrode and the gate electrode in a region between the source electrode and the drain electrode, the groove gradually deepened toward the source electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

A first embodiment discloses an InAlAs/InGaAs HEMT as a compound semiconductor device. The structure and method of manufacture of the InAlAs/InGaAs HEMT will now be described.

FIGS. 1 to 11 are schematic sectional views illustrating, in sequence, the individual steps of a method for manufacturing the InAlAs/InGaAs HEMT according to the first embodiment.

Figure 1A:
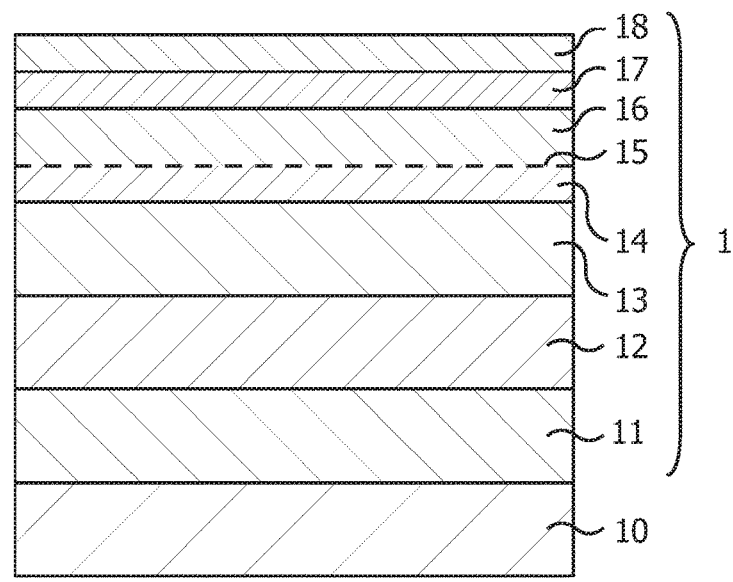
FIG. 1A is a schematic sectional view illustrating a step of a method for manufacturing an InAlAs/InGaAs HEMT according to a first embodiment.

As depicted in FIG. 1A, a buffer layer 11, a bottom barrier layer 12, a channel layer 13 serving as an electron transit layer, a spacer layer 14, a Si-δ-doped layer 15, a barrier layer 16 serving as an electron supply layer, an i-InP layer 17, and a capping layer 18 are first formed in sequence.

Specifically, the following compound semiconductors are grown, for example, by metal-organic chemical vapor deposition (MOCVD). Other processes such as molecular beam epitaxy (MBE) may be used in place of MOCVD.

A suitable buffer layer is formed on an InP substrate 10, and an i-$In_{0.52}Al_{0.48}As$ layer is then grown to a thickness of about 200 nm. An i-$In_{0.53}Ga_{0.47}As$ layer is then grown to a thickness of about 10 nm. An i-$In_{0.52}Al_{0.48}As$ layer is then grown to a thickness of about 3 nm. A very thin layer is then doped with Si to a concentration of, for example, about $1\times10^{13}/cm^3$. An i-$In_{0.52}Al_{0.48}As$ layer is then grown to a thickness of about 6 nm. An i-InP layer is then grown to a thickness of about 3 nm. An n-$In_{0.53}Ga_{0.47}As$ layer doped with an n-type impurity, such as Si, to a concentration of about $1\times10^{19}/cm^3$ is then grown to a thickness of about 20 nm.

Thus, the buffer layer 11, the bottom barrier layer 12, the channel layer 13, the spacer layer 14, the Si-δ-doped layer 15, the barrier layer 16, the i-InP layer 17, and the capping layer 18 are formed on top of each other on the InP substrate 10 to form a compound semiconductor multilayer structure 1.

Figure 1B:
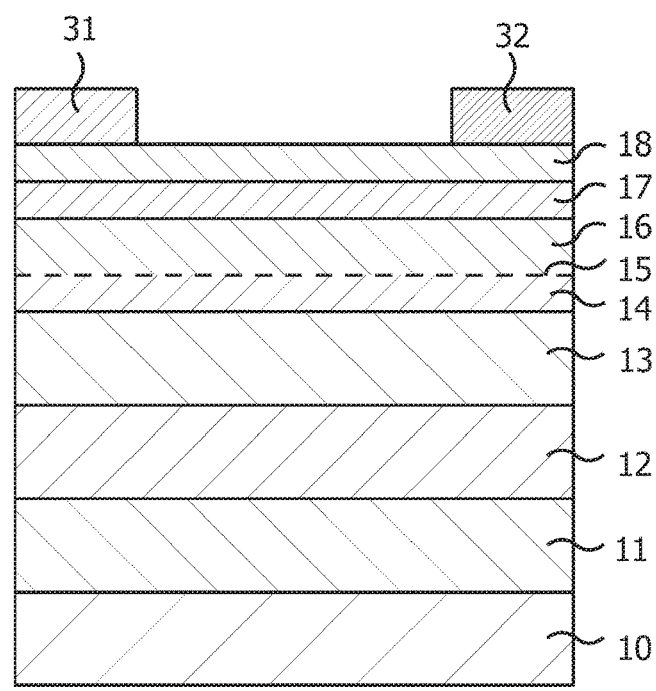
FIG. 1B is a schematic sectional view illustrating a step, following the step in FIG. 1A, of the method for manufacturing the InAlAs/InGaAs HEMT according to the first embodiment.

Following isolation, as depicted in FIG. 1B, a source electrode 31 and a drain electrode 32 are formed.

Specifically, a resist mask for forming the source electrode 31 and the drain electrode 32 is first formed. A resist is applied to the compound semiconductor multilayer structure 1 and is subjected to photolithography to form openings in which are exposed the areas where the electrodes 31 and 32 are to be formed on the compound semiconductor multilayer structure 1. Thus, a resist mask having the openings is formed.

Electrode materials, for example, titanium, platinum, and gold, are then deposited over the resist mask, including the openings in which are exposed the areas where the electrodes 31 and 32 are to be formed on the compound semiconductor multilayer structure 1, by a process such as evaporation. Titanium is deposited to a thickness of about 10 nm. Platinum is deposited to a thickness of about 10 nm. Gold is deposited to a thickness of about 200 nm. The resist mask and the titanium, platinum, and gold deposited thereon are removed by a lift-off process. The use of titanium, platinum, and gold provides an ohmic contact with the capping layer 18 without heat treatment. Thus, the source electrode 31 and the drain electrode 32 are formed.

Figure 2A:
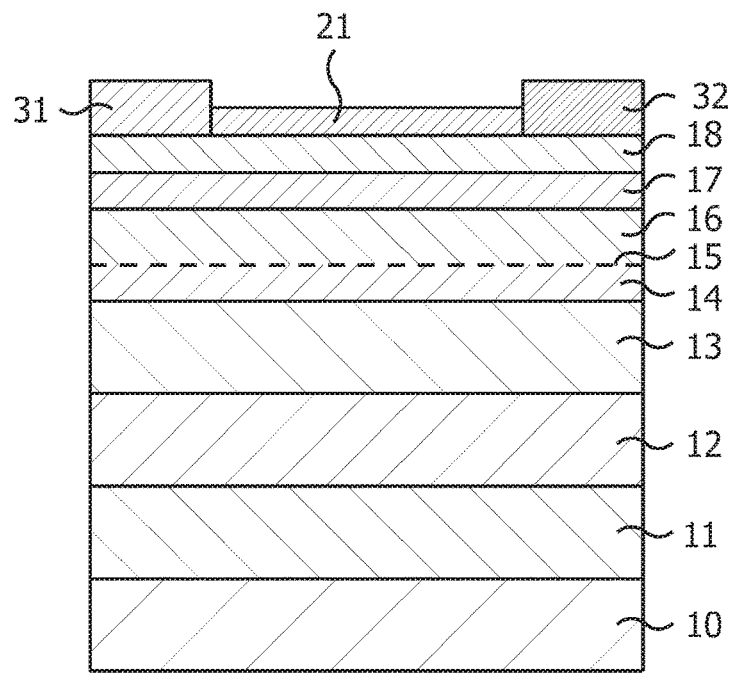
FIG. 2A is a schematic sectional view illustrating a step, following the step in FIG. 1B, of the method for manufacturing the InAlAs/InGaAs HEMT according to the first embodiment.

As depicted in FIG. 2A, a $SiO_2$ film 21 is then formed.

Specifically, an insulator, which is $SiO_2$ in this example, is deposited to a thickness of about 20 nm between the source electrode 31 and the drain electrode 32 on the compound semiconductor multilayer structure 1 by a process such as plasma-enhanced CVD. Thus, the $SiO_2$ film 21 is formed.

Figure 2B:
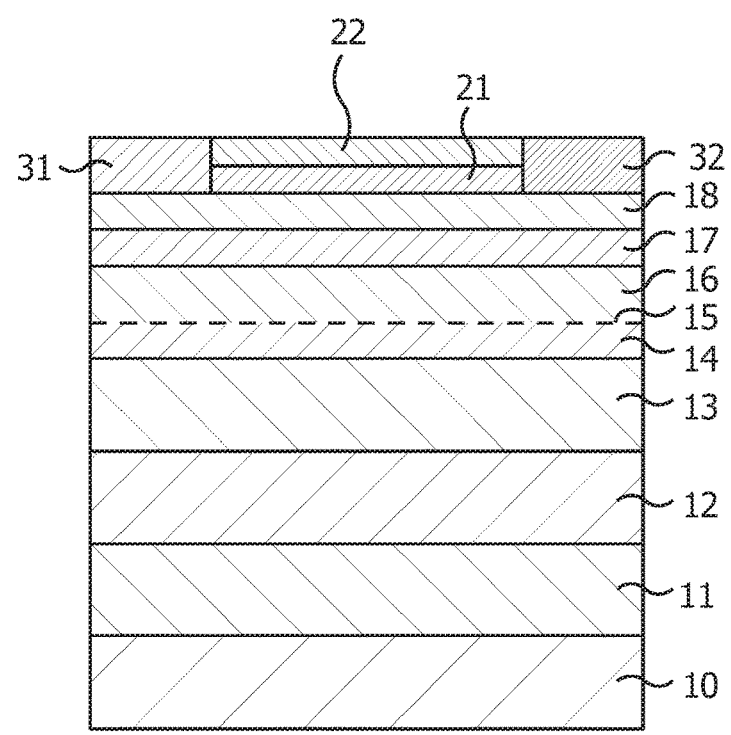
FIG. 2B is a schematic sectional view illustrating a step, following the step in FIG. 2A, of the method for manufacturing the InAlAs/InGaAs HEMT according to the first embodiment.

As depicted in FIG. 2B, a resist film 22 is then formed.

Specifically, a resist, for example, a ZEP resist available from Zeon Corporation, is applied to the $SiO_2$ film 21. Thus, the resist film 22 is formed.

Figure 3A:
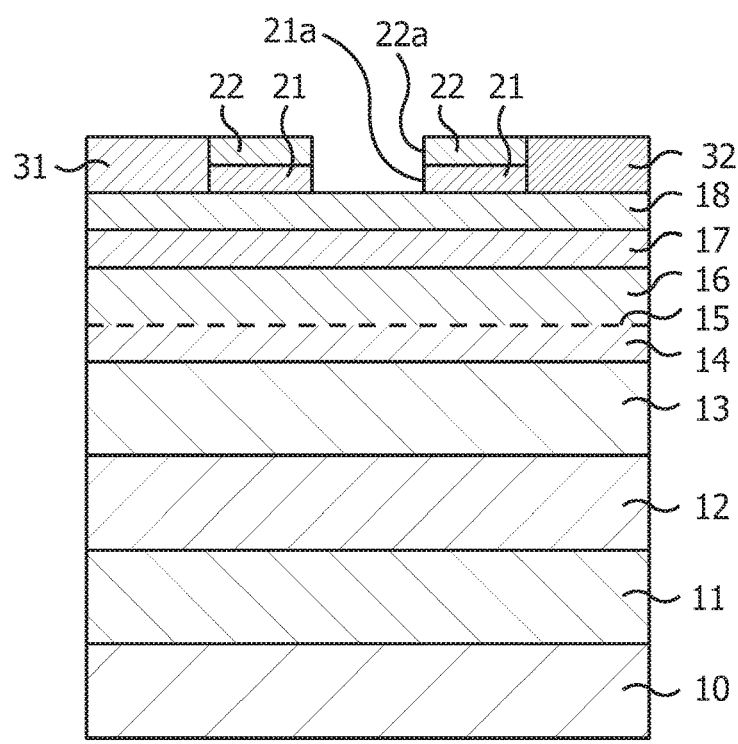
FIG. 3A is a schematic sectional view illustrating a step, following the step in FIG. 2B, of the method for manufacturing the InAlAs/InGaAs HEMT according to the first embodiment.

As depicted in FIG. 3A, an opening 21*a* is then formed in the $SiO_2$ film 21.

Specifically, an opening 22*a* is first formed in the resist film 22 by a process such as electron beam exposure.

The opening 21*a* is then formed in the $SiO_2$ film 21 by reactive ion etching using the resist film 22 as a mask. The etching gas is, for example, $CF_4$.

The resist film 22 is then removed by chemical treatment or ashing.

Figure 3B:
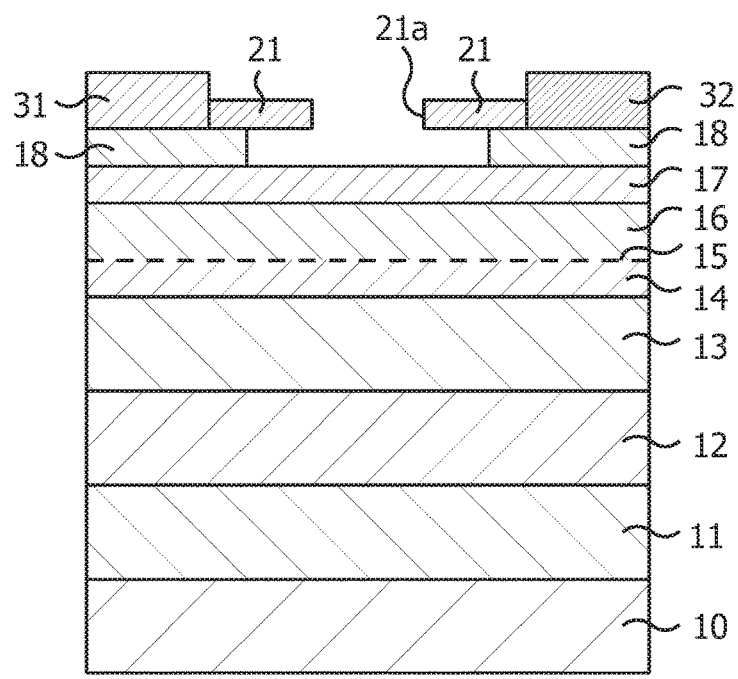
FIG. 3B is a schematic sectional view illustrating a step, following the step in FIG. 3A, of the method for manufacturing the InAlAs/InGaAs HEMT according to the first embodiment.

As depicted in FIG. 3B, the capping layer 18 is then etched.

Specifically, the capping layer 18 is wet-etched to electrically divide the capping layer 18. The etchant is, for example, a solution containing citric acid ($C_6H_8O_7$) and hydrogen peroxide ($H_2O_2$).

Figure 4A:
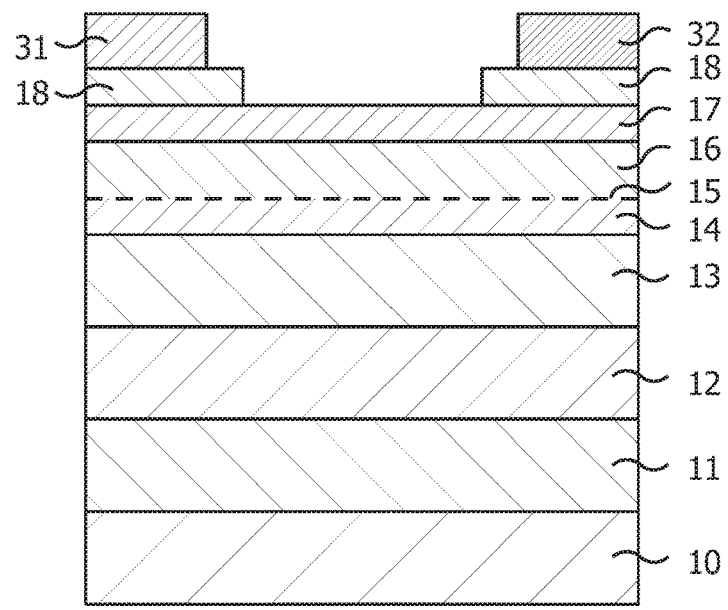
FIG. 4A is a schematic sectional view illustrating a step, following the step in FIG. 3B, of the method for manufacturing the InAlAs/InGaAs HEMT according to the first embodiment.

As depicted in FIG. 4A, the remaining $SiO_2$ film 21 is then removed by wet etching.

Figure 4B:
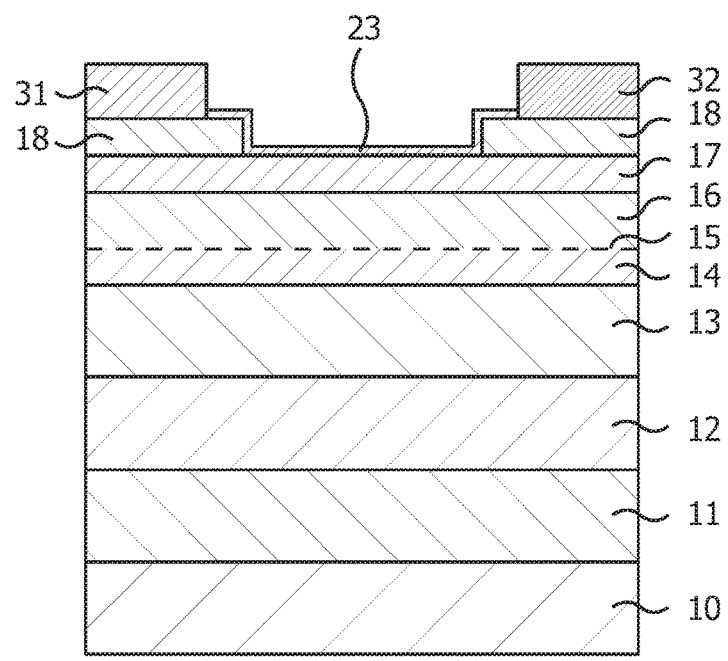
FIG. 4B is a schematic sectional view illustrating a step, following the step in FIG. 4A, of the method for manufacturing the InAlAs/InGaAs HEMT according to the first embodiment.

As depicted in FIG. 4B, a $SiO_2$ film 23 is then formed.

Specifically, an insulator, which is $SiO_2$ in this example, is deposited between the source electrode 31 and the drain electrode 32 on the compound semiconductor multilayer structure 1 by a process such as plasma-enhanced CVD. Thus, the $SiO_2$ film 23 is formed.

Figure 5A:
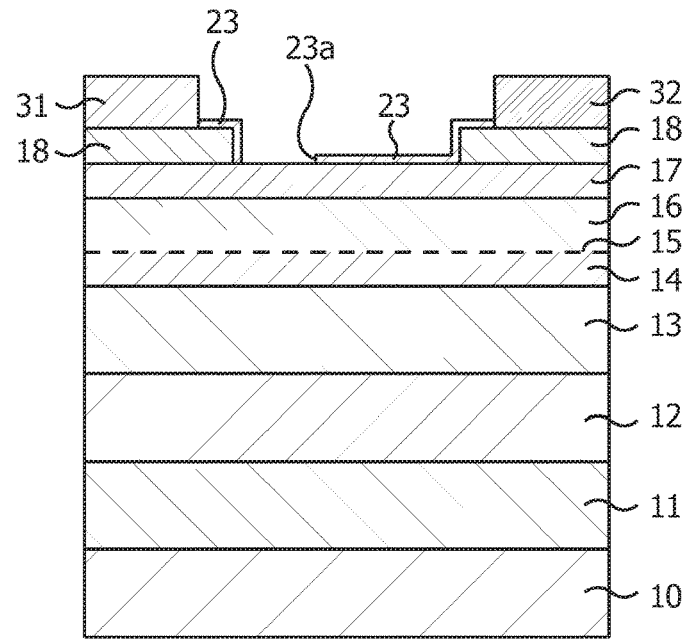
FIG. 5A is a schematic sectional view illustrating a step, following the step in FIG. 4B, of the method for manufacturing the InAlAs/InGaAs HEMT according to the first embodiment.

As depicted in FIG. 5A, an opening 23*a* is then formed in the $SiO_2$ film 23.

Specifically, a resist is first applied to the $SiO_2$ film 23 and is subjected to a process such as electron beam exposure to form an opening in the resist.

The opening 23*a* is then formed in the $SiO_2$ film 23 by reactive ion etching using the resist as a mask. The etching gas is, for example, $CF_4$. The opening 23*a* is located closer to the source electrode 31 and has a length of, for example, about 150 nm.

The resist is then removed by chemical treatment or ashing.

Figure 5B:
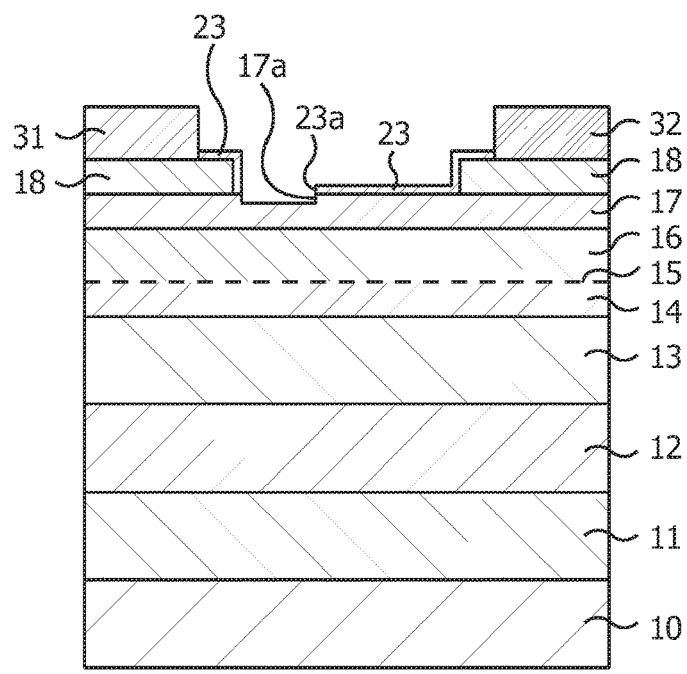
FIG. 5B is a schematic sectional view illustrating a step, following the step in FIG. 5A, of the method for manufacturing the InAlAs/InGaAs HEMT according to the first embodiment.

As depicted in FIG. 5B, a groove 17*a* is then formed in the i-InP layer 17.

Specifically, the i-InP layer 17 is wet-etched to a depth of about 1 to 2 nm to form the groove 17*a*. The etchant is, for example, a solution containing citric acid ($C_6H_8O_7$) and hydrogen peroxide ($H_2O_2$).

Figure 6A:
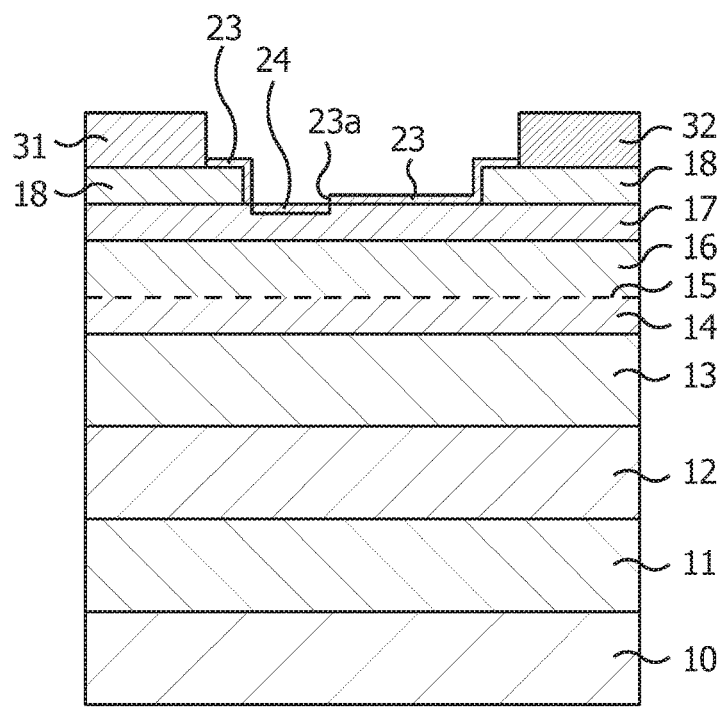
FIG. 6A is a schematic sectional view illustrating a step, following the step in FIG. 5B, of the method for manufacturing the InAlAs/InGaAs HEMT according to the first embodiment.

As depicted in FIG. 6A, a $SiO_2$ film 24 is then formed in the groove 17*a*.

Specifically, an insulator, which is $SiO_2$ in this example, is deposited in the groove 17*a* by a process such as plasma-enhanced CVD. Thus, the $SiO_2$ film 24 is formed.

Figure 6B:
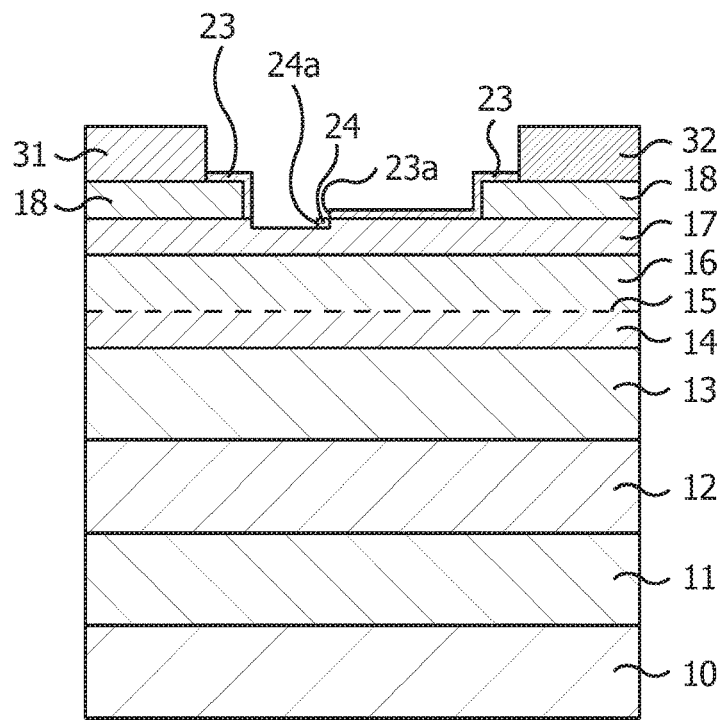
FIG. 6B is a schematic sectional view illustrating a step, following the step in FIG. 6A, of the method for manufacturing the InAlAs/InGaAs HEMT according to the first embodiment.

As depicted in FIG. 6B, an opening 24*a* is then formed in the $SiO_2$ film 24.

Specifically, a resist is first applied to the $SiO_2$ film 24 and is subjected to a process such as electron beam exposure to form an opening in the resist.

The opening 24*a* is then formed in the $SiO_2$ film 24 by reactive ion etching using the resist as a mask. The etching gas is, for example, $CF_4$. The opening 24*a* is shorter than the opening 23*a* and has a length of, for example, about 130 nm. The end of the opening 24*a* closer to the source electrode 31 is aligned with the end of the opening 23*a* closer to the source electrode 31.

The resist is then removed by chemical treatment or ashing.

Figure 7A:
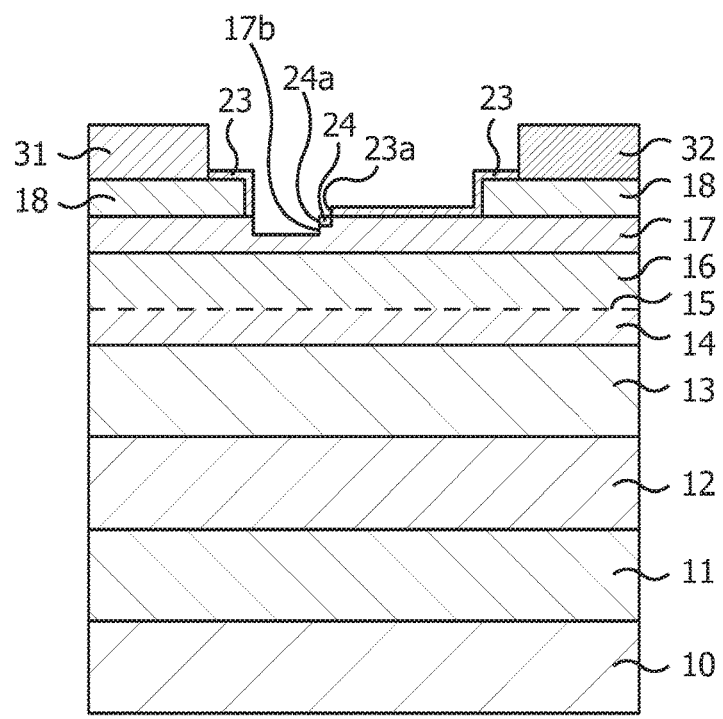
FIG. 7A is a schematic sectional view illustrating a step, following the step in FIG. 6B, of the method for manufacturing the InAlAs/InGaAs HEMT according to the first embodiment.

As depicted in FIG. 7A, a groove 17*b* is then formed in the i-InP layer 17.

Specifically, the i-InP layer 17 is wet-etched to a depth of about 1 to 2 nm to form the groove 17*b*. The groove 17*b* is deeper than the remaining groove 17*a* by about 1 to 2 nm; therefore, a step is formed between the grooves 17*a* and 17*b*. The etchant is, for example, a solution containing citric acid ($C_6H_8O_7$) and hydrogen peroxide ($H_2O_2$).

Figure 7B:
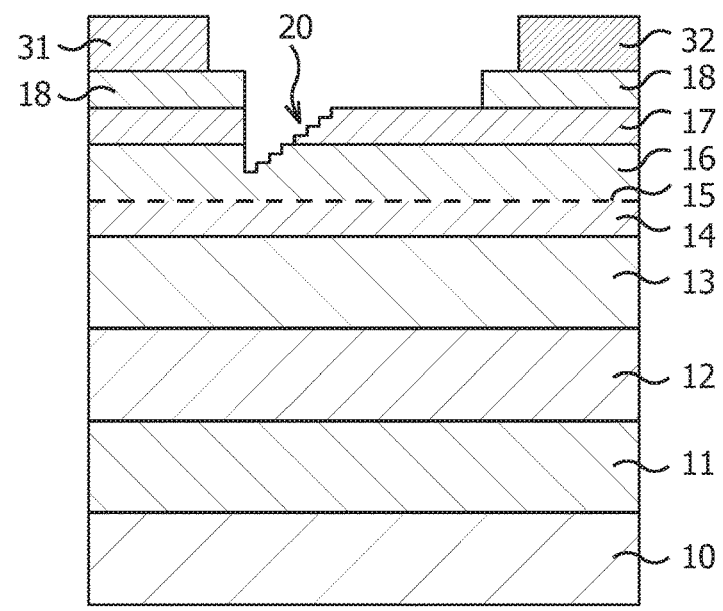
FIG. 7B is a schematic sectional view illustrating a step, following the step in FIG. 7A, of the method for manufacturing the InAlAs/InGaAs HEMT according to the first embodiment.

As depicted in FIG. 7B, a stepped groove 20 is then formed.

Specifically, grooves are formed by repeating the steps in FIGS. 6A to 7A. Thus, the stepped groove 20 is formed in the compound semiconductor multilayer structure 1 in the region from near the source electrode 31 to the end, closer to the source electrode 31, of the area where the gate electrode 33 is to be formed. The stepped groove 20 is formed, at its deepest point, to a depth within the barrier layer 16 between the source electrode 31 and the gate electrode 33 such that it becomes stepwise deeper toward the source electrode 31.

Figure 8A:
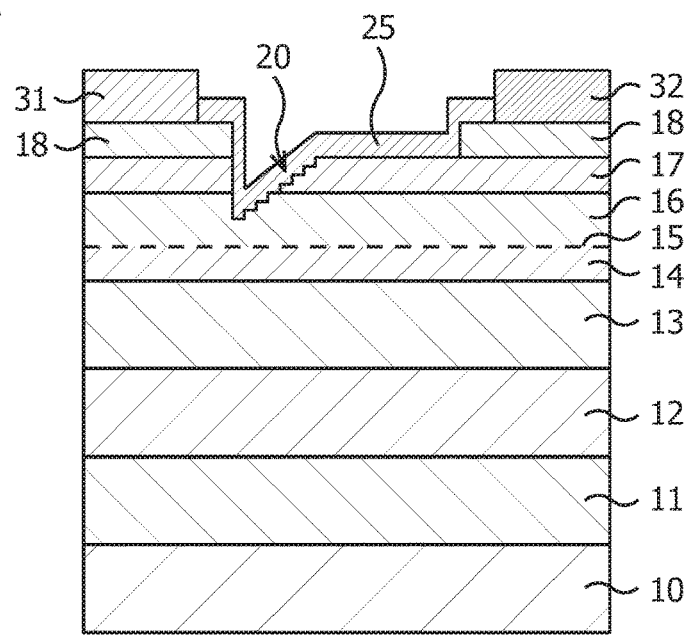
FIG. 8A is a schematic sectional view illustrating a step, following the step in FIG. 7B, of the method for manufacturing the InAlAs/InGaAs HEMT according to the first embodiment.

As depicted in FIG. 8A, the $SiO_2$ film 25 is then formed.

Specifically, an insulator, which is $SiO_2$ in this example, is deposited between the source electrode 31 and the drain electrode 32 on the compound semiconductor multilayer structure 1 by a process such as plasma-enhanced CVD to cover the stepped groove 20. Thus, the $SiO_2$ film 25 is formed.

Figure 8B:
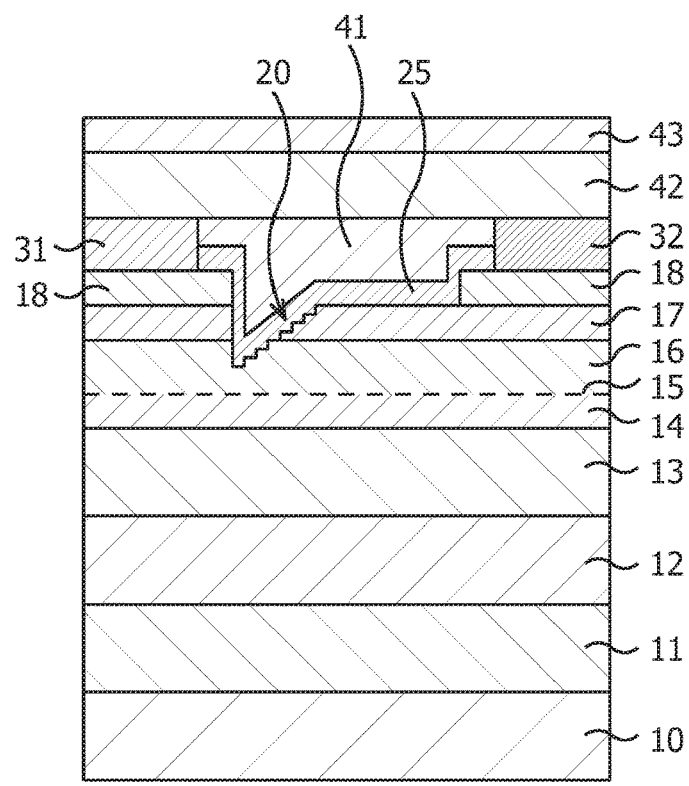
FIG. 8B is a schematic sectional view illustrating a step, following the step in FIG. 8A, of the method for manufacturing the InAlAs/InGaAs HEMT according to the first embodiment.

As depicted in FIG. 8B, three resist films 41 to 43 are then formed on top of each other.

Specifically, for example, a ZEP resist available from Zeon Corporation, a polydimethylglutarimide (PMGI) resist, and a ZEP resist are applied in sequence to cover the compound semiconductor multilayer structure 1. Thus, the resist films 41 to 43 are formed.

Figure 9A:
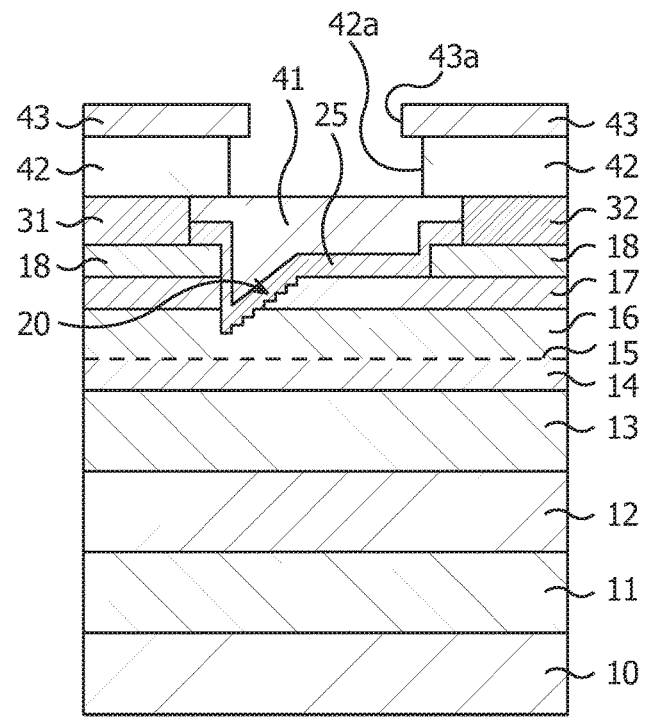
FIG. 9A is a schematic sectional view illustrating a step, following the step in FIG. 8B, of the method for manufacturing the InAlAs/InGaAs HEMT according to the first embodiment.

As depicted in FIG. 9A, openings 42*a* and 43*a* are then formed in the resist films 42 and 43, respectively.

Specifically, the resist films 42 and 43 are exposed in the areas where the head of the T-gate is to be formed by a process such as electron beam exposure to form the openings 42*a* and 43*a* in the resist films 42 and 43, respectively.

Figure 9B:
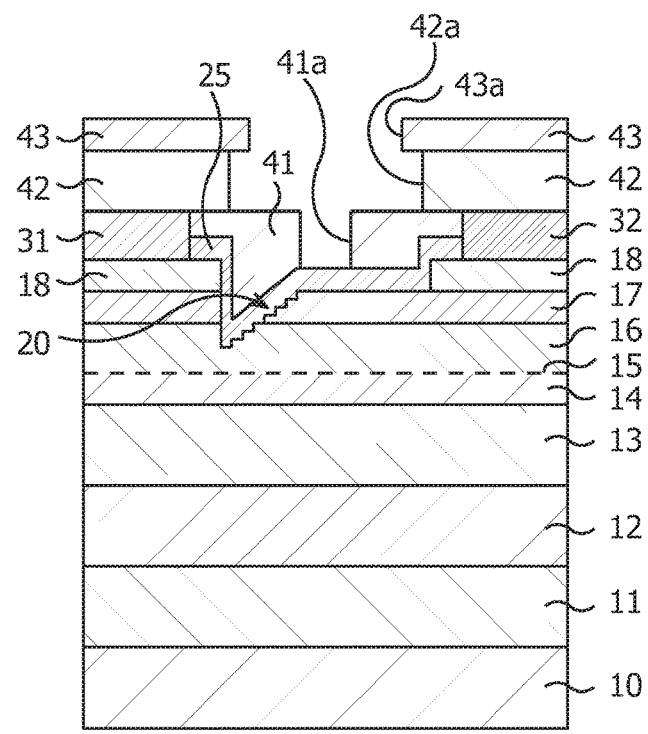
FIG. 9B is a schematic sectional view illustrating a step, following the step in FIG. 9A, of the method for manufacturing the InAlAs/InGaAs HEMT according to the first embodiment.

As depicted in FIG. 9B, an opening 41*a* is then formed in the resist film 41.

Specifically, the resist film 41 is exposed in the area where the foot of the T-gate is to be formed by a process such as electron beam exposure depending on the target gate length to form the opening 41*a* in the resist film 41.

Figure 10A:
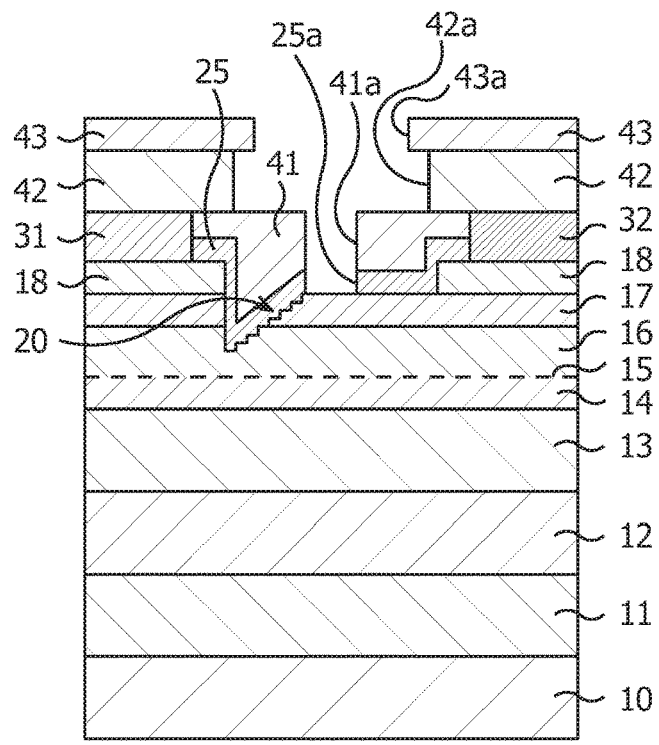
FIG. 10A is a schematic sectional view illustrating a step, following the step in FIG. 9B, of the method for manufacturing the InAlAs/InGaAs HEMT according to the first embodiment.

As depicted in FIG. 10A, an opening 25*a* is then formed in the $SiO_2$ film 25.

Specifically, the opening 25*a* is formed in the $SiO_2$ film 25 by reactive ion etching using the resist film 41 as a mask. The etching gas is, for example, $CF_4$.

Figure 10B:
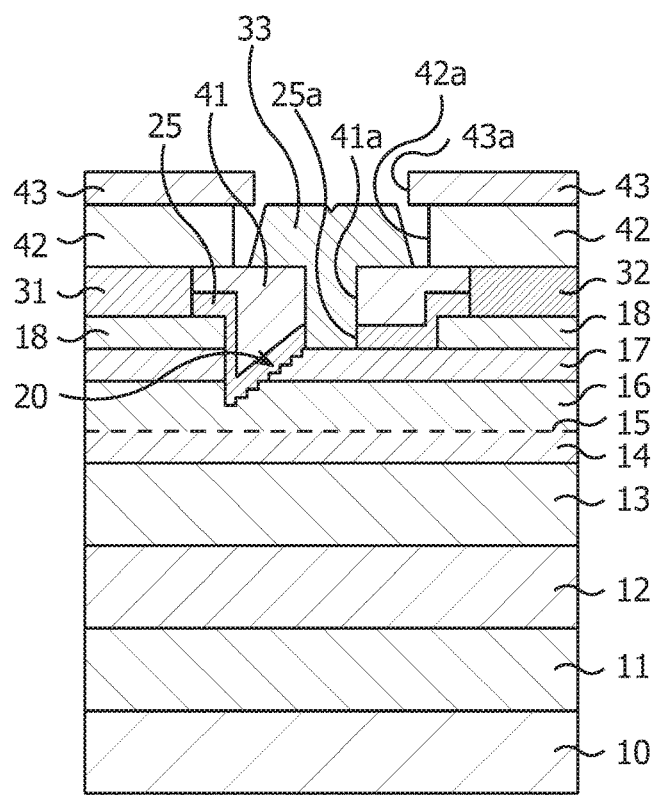
FIG. 10B is a schematic sectional view illustrating a step, following the step in FIG. 10A, of the method for manufacturing the InAlAs/InGaAs HEMT according to the first embodiment.
Figure 11:
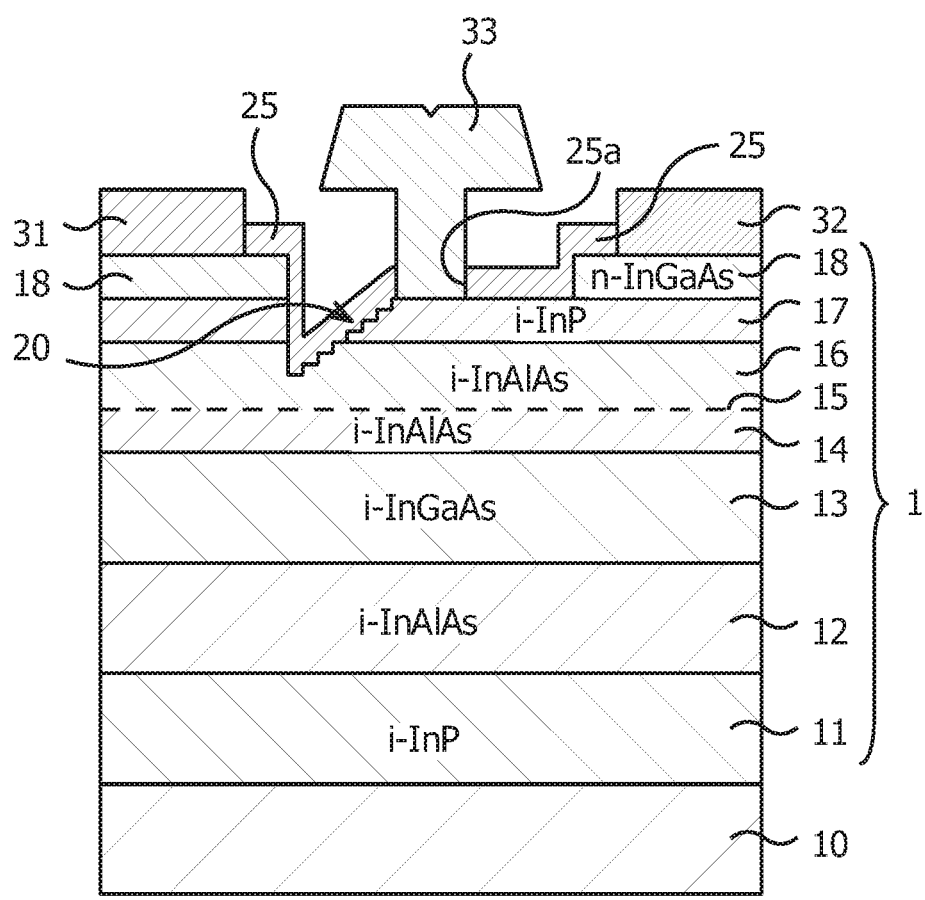
FIG. 11 is a schematic sectional view illustrating a step, following the step in FIG. 10B, of the method for manufacturing the InAlAs/InGaAs HEMT according to the first embodiment.

As depicted in FIGS. 10B and 11, a gate electrode 33 is then formed.

Specifically, electrode materials, for example, titanium, platinum, and gold, are deposited over the resist film 43, including the openings 41*a* to 43*a*, by a process such as evaporation using the resist films 41 to 43 as a mask. Titanium is deposited to a thickness of about 10 nm. Platinum is deposited to a thickness of about 5 nm. Gold is deposited to a thickness of about 400 nm. The resist films 41 to 43 and the titanium, platinum, and gold deposited thereon are then removed by a lift-off process. Thus, as depicted in FIG. 11, the T-gate electrode 33 is formed on the i-InP layer 17.

In this way, the InAlAs/InGaAs HEMT according to this embodiment is fabricated.

This embodiment illustrates the fabrication of a Schottky InAlAs/InGaAs HEMT in which the gate electrode 33 directly contacts the compound semiconductor multilayer structure 1. Instead of a Schottky InAlAs/InGaAs HEMT, a metal-insulator-semiconductor (MIS) InAlAs/InGaAs HEMT may be fabricated in which the gate electrode 33 is formed above the compound semiconductor multilayer structure 1 with a gate insulator therebetween. This may be done by skipping the step in FIG. 10A, in which the opening 25a is formed in the SiO₂ film 25, that is, by performing the step in FIG. 9B and then performing the step in FIG. 10B and the subsequent steps.

Figure 12:
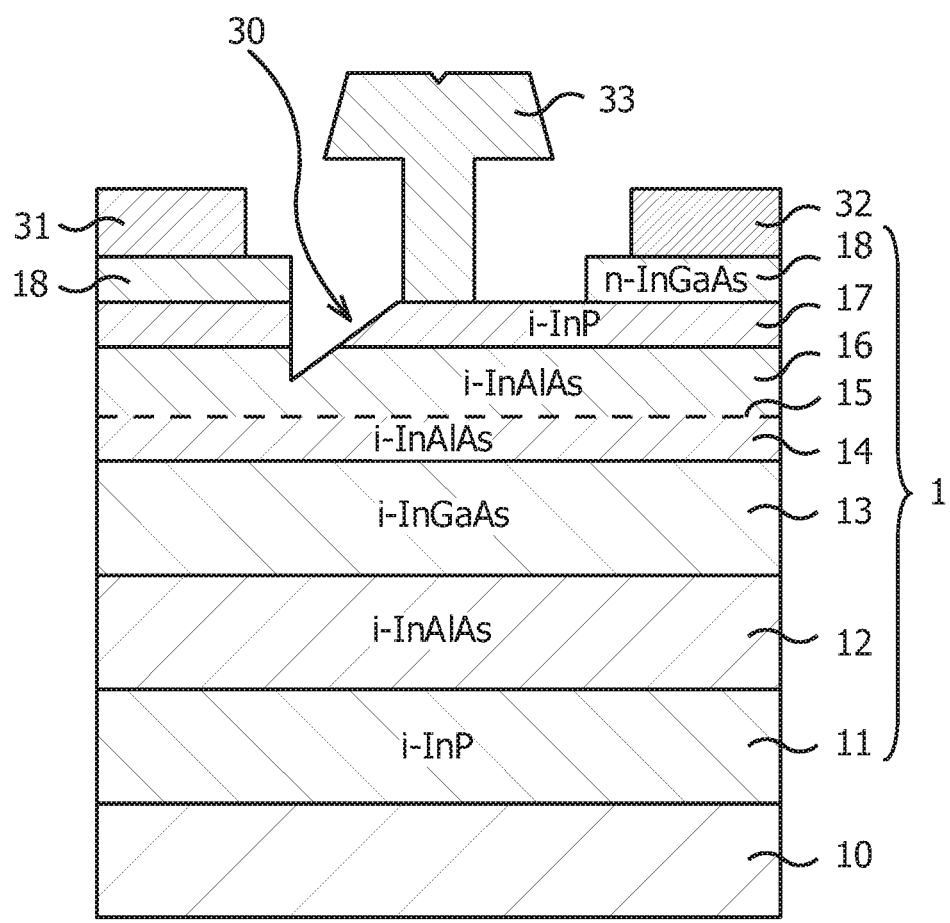
FIG. 12 is a schematic sectional view illustrating, in outline, an InAlAs/InGaAs HEMT having a tapered groove according to the first embodiment.

As illustrated in FIG. 11, the InAlAs/InGaAs HEMT according to this embodiment has the stepped groove 20 that becomes stepwise deeper toward the source electrode 31 between the source electrode 31 and the gate electrode 33. As the step height of the stepped groove 20 is reduced, it may eventually be considered as a continuous inclined groove. In practice, the minimum possible step height is equivalent to one monoatomic layer of the compound semiconductor. FIG. 12 depicts an InAlAs/InGaAs HEMT according to this embodiment in which an inclined groove that may be considered as being continuous, namely, a tapered groove 30 that becomes gradually deeper toward the source electrode 31, is formed between the source electrode 31 and the gate electrode 33. The SiO₂ film 25 is not depicted in FIG. 12. The InAlAs/InGaAs HEMT according to this embodiment in which the tapered groove 30 is formed and its advantages will now be described.

Figure 13:
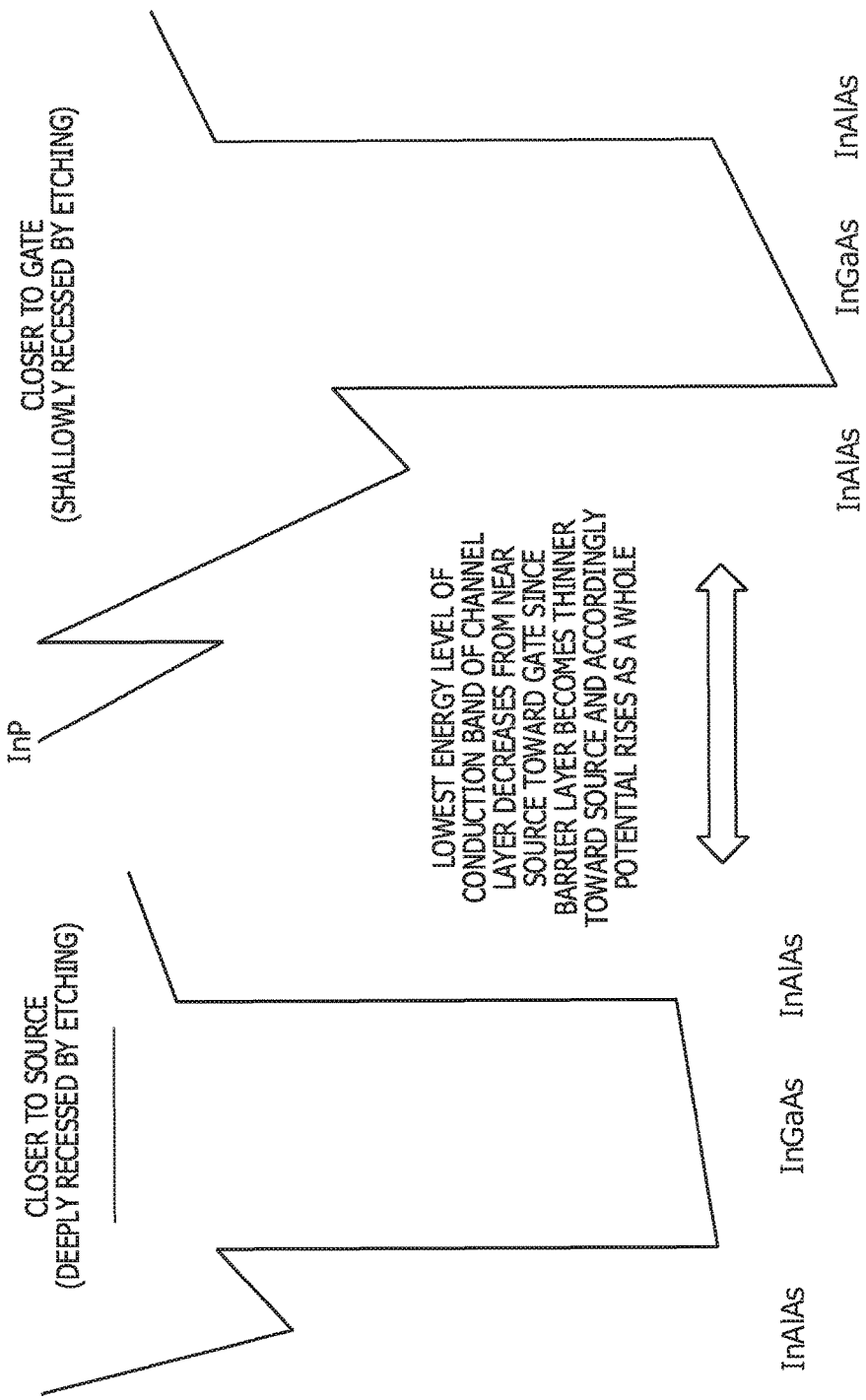
FIG. 13 is a schematic diagram depicting the conduction band structures, in the perpendicular direction, in a region closer to a source electrode and a region closer to a gate electrode in the first embodiment.

FIG. 13 is a schematic diagram depicting the conduction band structures, in the perpendicular direction, in the region closer to the source electrode 31 and the region closer to the gate electrode 33 in the InAlAs/InGaAs HEMT according to this embodiment.

As illustrated in FIG. 13, the lowest energy level of the conduction band of the channel layer 13 decreases from near the source electrode 31 toward the gate electrode 33, thus forming an internal electric field between the source electrode 31 and the gate electrode 33. This is because, due to the formation of the tapered groove 30, the barrier layer 16 becomes thinner toward the source electrode 31 and accordingly the potential rises as a whole.

Figure 14A:
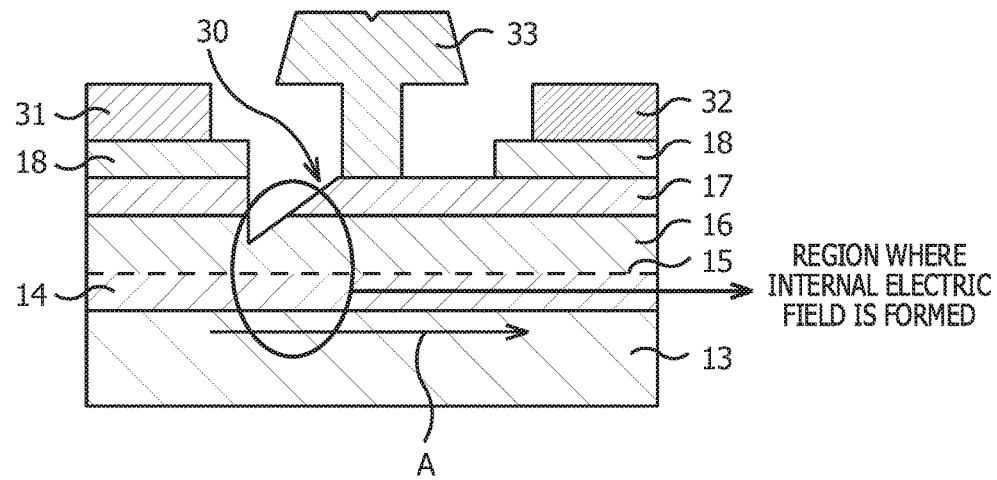
FIGS. 14A and 14B are schematic diagrams illustrating a potential change in the InAlAs/InGaAs HEMT according to the first embodiment.
Figure 14B:
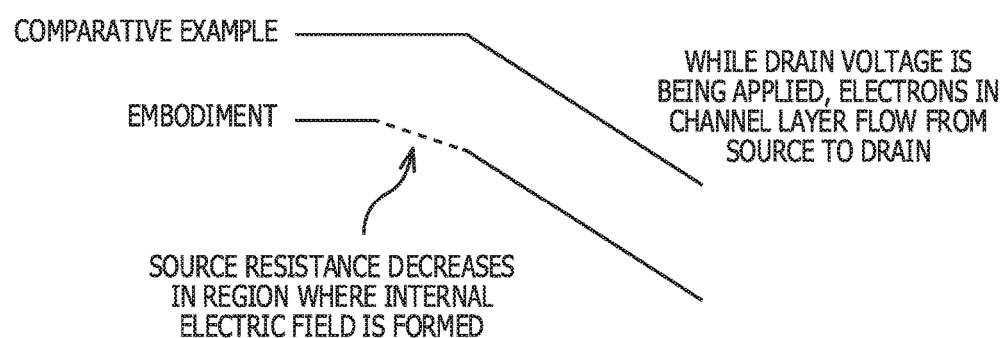

FIGS. 14A and 14B are schematic diagrams illustrating the potential change in the InAlAs/InGaAs HEMT according to this embodiment. FIG. 14A is a schematic sectional view, and FIG. 14B is a characteristic diagram depicting the conduction band structure of the channel layer 13 based on a comparison with a comparative example. The comparative example is an InAlAs/InGaAs HEMT in the related art that includes a compound semiconductor multilayer structure having a flat surface in which no tapered groove 30 is formed.

While a drain voltage is being applied, electrons in the channel layer 13 flow from the source electrode 31 to the drain electrode 32. In this embodiment, as depicted in FIG. 14A, the tapered groove 30 (enclosed by the circle in FIG. 14A) is formed in the compound semiconductor multilayer structure 1. As a result, as depicted in FIG. 14B, the potential decreases along arrow A between the source electrode 31 and the gate electrode 33, thus forming an internal electric field and decreasing the source resistance.

As described above, the tapered groove 30 that becomes stepwise deeper toward the source electrode 31 is formed in the region between the source electrode 31 and the gate electrode 33, thus forming an internal electric field in that region. This enhances the acceleration of electrons between the source electrode 31 and the gate electrode 33 as compared to the comparative example. The drain current $I_{ds}$ is expressed as follows:

$$I_{ds}=nev$$

where n is the electron density, e is the unit charge, and v is the electron velocity. The electron densities n in this embodiment and the comparative example are almost equal since electrons are similarly supplied from an n-type ohmic contact. The electron velocity v, in contrast, is increased by the internal electric field. This increases the drain current and thus decreases the source resistance as compared to the comparative example.

Figure 15:
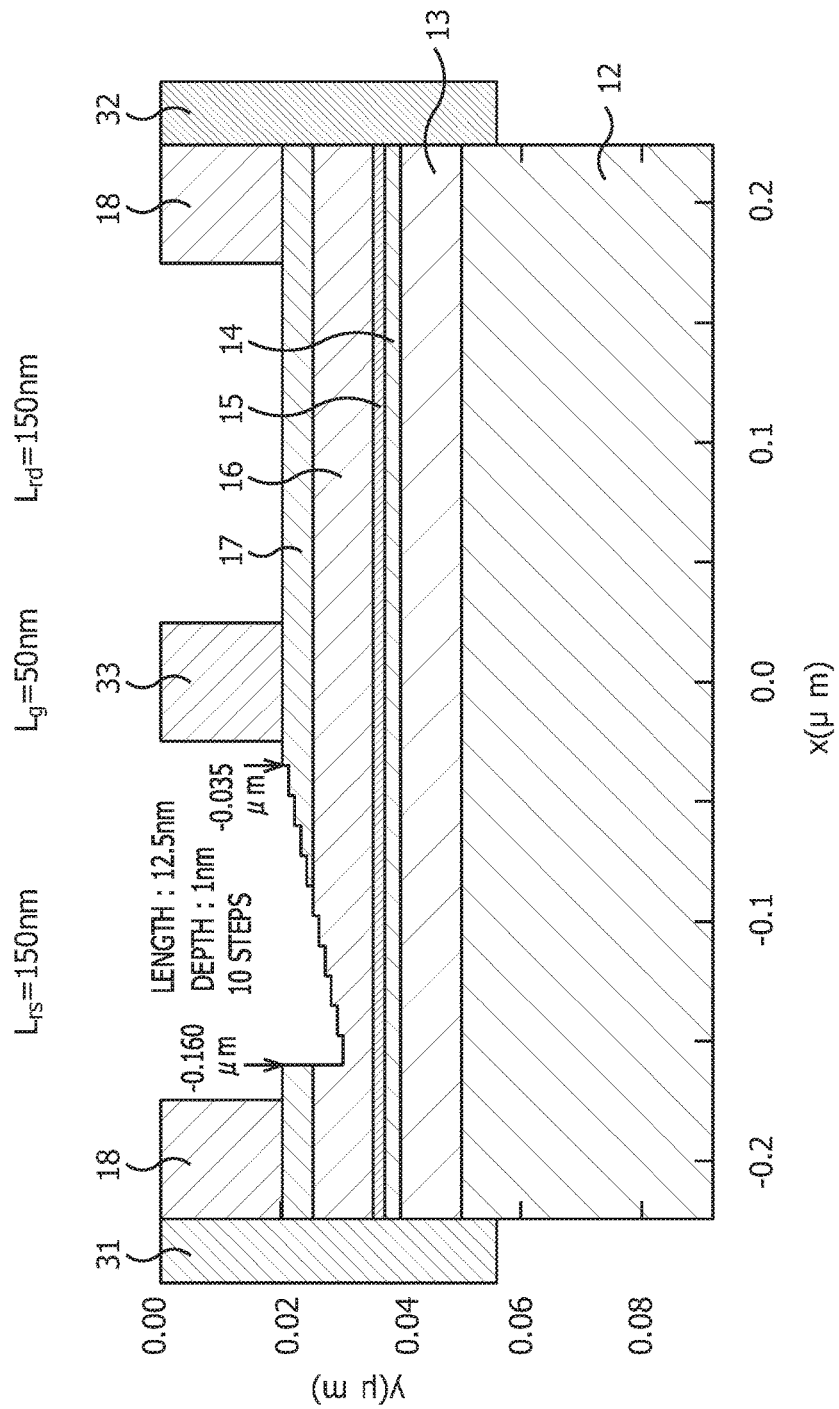
FIG. 15 is a schematic sectional view depicting an InAlAs/InGaAs HEMT according to the first embodiment for simulation.
Figure 16:
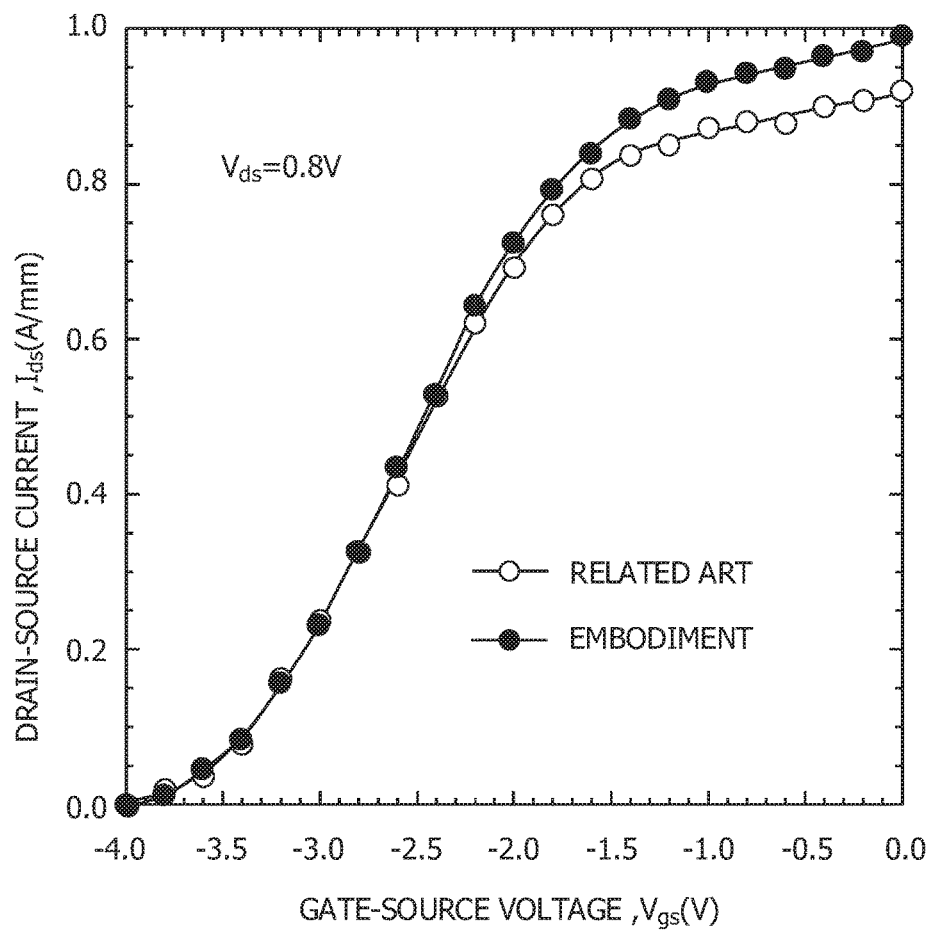
FIG. 16 is a characteristic diagram depicting the results of a simulation for testing the InAlAs/InGaAs HEMT according to the first embodiment for drain current $I_{ds}$-gate voltage $V_{gs}$ characteristics based on a comparison with a comparative example.
Figure 17:
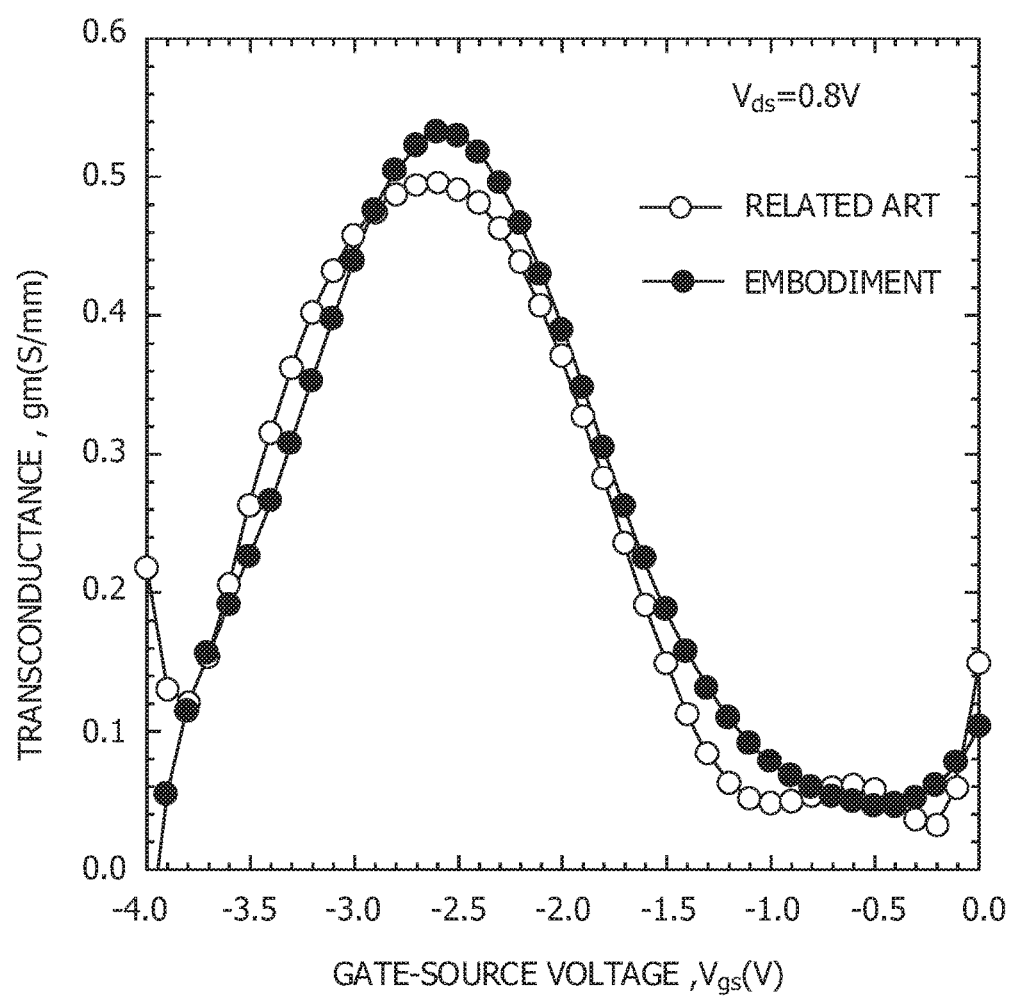
FIG. 17 is a characteristic diagram depicting the results of a simulation for testing the InAlAs/InGaAs HEMT according to the first embodiment for the dependence of transconductance $g_m$ on gate voltage $V_{gs}$ based on a comparison with the comparative example.

FIG. 15 is a schematic sectional view depicting an InAlAs/InGaAs HEMT according to this embodiment for simulation. FIG. 16 is a characteristic diagram depicting the results of a simulation for testing the InAlAs/InGaAs HEMT according to this embodiment for drain current $I_{ds}$-gate voltage $V_{gs}$ characteristics based on a comparison with the comparative example. FIG. 17 is a characteristic diagram depicting the results of a simulation for testing the InAlAs/InGaAs HEMT according to this embodiment for the dependence of transconductance $g_m$ on gate voltage $V_{gs}$ based on a comparison with the comparative example.

The comparative example, in which the compound semiconductor multilayer structure has a flat surface between the source electrode and the gate electrode, had a maximum transconductance $g_m$ of 0.496 (S/mm). This embodiment, in which the compound semiconductor multilayer structure 1 has the tapered groove 30 formed between the source electrode 31 and the gate electrode 33, had a maximum transconductance $g_m$ of 0.533 (S/mm), which is higher than that of the comparative example. Thus, the presence of the tapered groove 30 resulted in a higher maximum drain current and a higher maximum transconductance, which demonstrates the effectiveness of this embodiment.

As described above, this embodiment provides a reliable InAlAs/InGaAs HEMT with reduced source resistance and thus improved operating speed.

Modifications of First Embodiment

Various HEMTs according to modifications of this embodiment will now be described.

First Modification

A first modification discloses an AlGaAs/GaAs HEMT.

Figure 18:
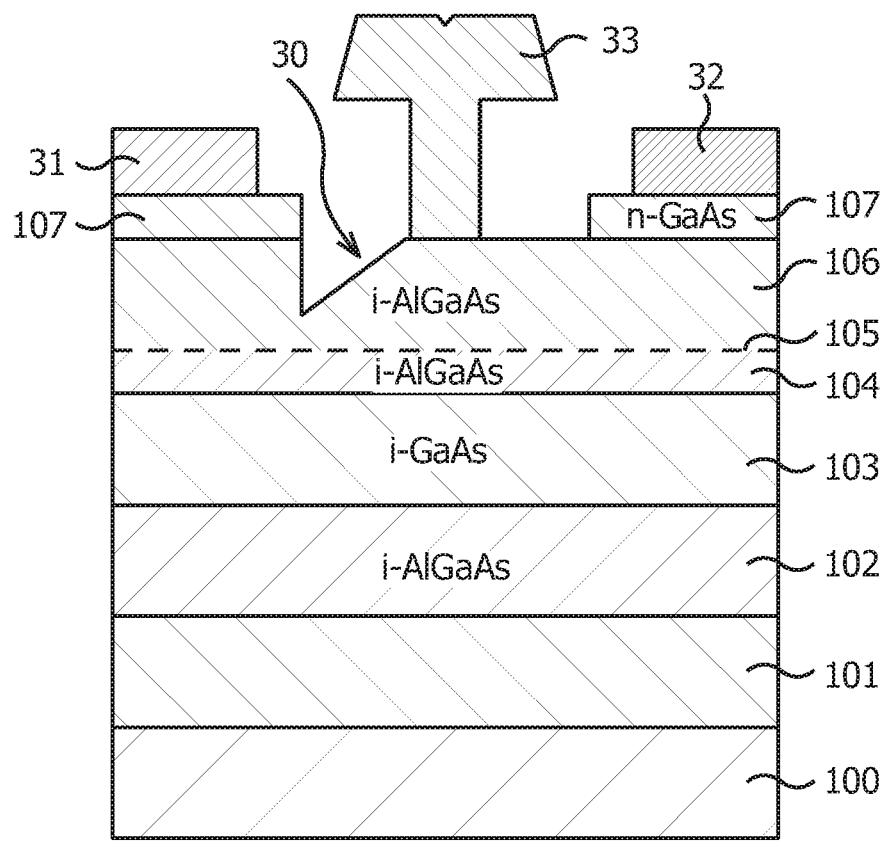
FIG. 18 is a schematic sectional view depicting an AlGaAs/GaAs HEMT according to a first modification of the first embodiment.

FIG. 18 is a schematic sectional view depicting the AlGaAs/GaAs HEMT according to the first modification.

This AlGaAs/GaAs HEMT includes a substrate 100 on which are formed in sequence a buffer layer 101, a bottom barrier layer 102, a channel layer 103, a spacer layer 104, a Si-δ-doped layer 105, a barrier layer 106, and a capping layer 107.

The bottom barrier layer 102 is formed by growing i-AlGaAs (for example, i-Al₀.₃Ga₀.₇As). The channel layer 103 is formed by growing i-GaAs. The spacer layer 104 is formed by growing i-AlGaAs (for example, i-Al₀.₃Ga₀.₇As). The Si-δ-doped layer 105 is formed by doping a very thin layer with Si. The barrier layer 106 is formed by growing i-AlGaAs (for example, i-Al₀.₃Ga₀.₇As). The capping layer 107 is formed by growing n-GaAs.

A source electrode 31 and a drain electrode 32 are formed on the capping layer 107, and a gate electrode 33 is formed on the barrier layer 106. A tapered groove 30 is formed between the source electrode 31 and the gate electrode 33 such that it becomes gradually deeper toward the source electrode 31. The tapered groove 30 is formed, at its deepest point, to a depth within the barrier layer 106.

This modification provides a reliable AlGaAs/GaAs HEMT with reduced source resistance and thus improved operating speed.

Second Modification

A second modification discloses an AlGaAs/InGaAs HEMT.

Figure 19:
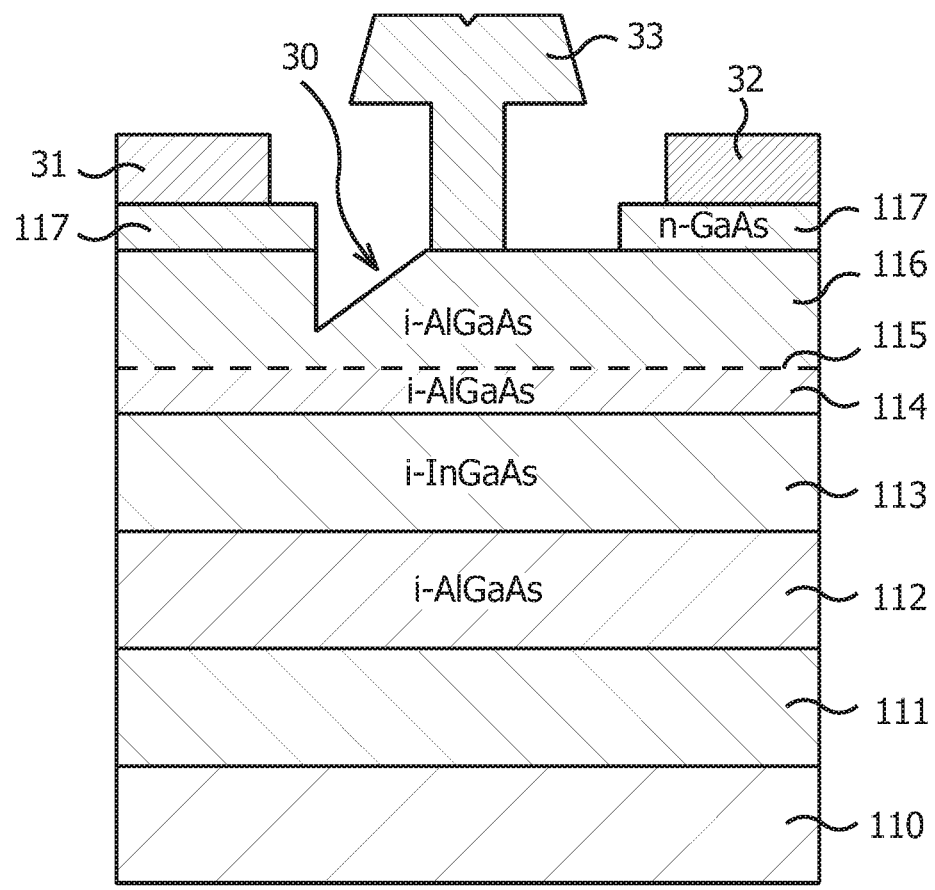
FIG. 19 is a schematic sectional view depicting an AlGaAs/InGaAs HEMT according to a second modification of the first embodiment.

FIG. 19 is a schematic sectional view depicting the AlGaAs/InGaAs HEMT according to the second modification.

This AlGaAs/InGaAs HEMT includes a substrate 110 on which are formed in sequence a buffer layer 111, a bottom barrier layer 112, a channel layer 113, a spacer layer 114, a Si-δ-doped layer 115, a barrier layer 116, and a capping layer 117.

The bottom barrier layer 112 is formed by growing i-AlGaAs (for example, i-$Al_{0.3}Ga_{0.7}As$). The channel layer 113 is formed by growing i-InGaAs. The spacer layer 114 is formed by growing i-AlGaAs (for example, i-$Al_{0.3}Ga_{0.7}As$). The Si-δ-doped layer 115 is formed by doping a very thin layer with Si. The barrier layer 116 is formed by growing i-AlGaAs (for example, i-$Al_{0.3}Ga_{0.7}As$). The capping layer 117 is formed by growing n-GaAs.

A source electrode 31 and a drain electrode 32 are formed on the capping layer 117, and a gate electrode 33 is formed on the barrier layer 116. A tapered groove 30 is formed between the source electrode 31 and the gate electrode 33 such that it becomes gradually deeper toward the source electrode 31. The tapered groove 30 is formed, at its deepest point, to a depth within the barrier layer 116.

This modification provides a reliable AlGaAs/InGaAs HEMT with reduced source resistance and thus improved operating speed.

Third Modification

A third modification discloses an AlSb/InAs HEMT.

Figure 20:
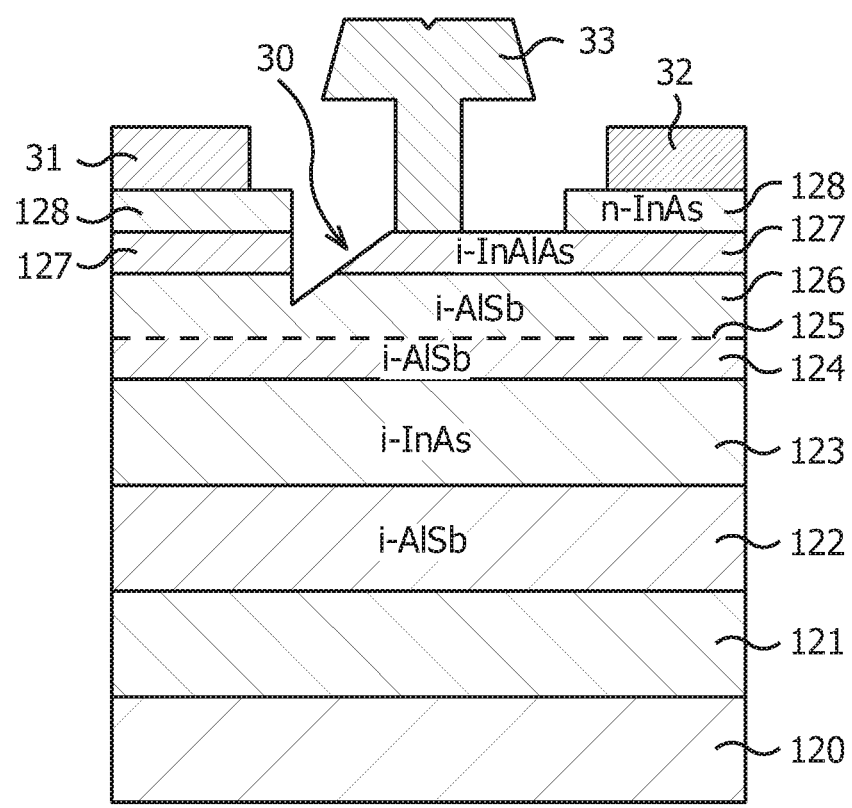
FIG. 20 is a schematic sectional view depicting an AlSb/InAs HEMT according to a third modification of the first embodiment.

FIG. 20 is a schematic sectional view depicting the AlSb/InAs HEMT according to the third modification.

This AlSb/InAs HEMT includes a substrate 120 on which are formed in sequence a buffer layer 121, a bottom barrier layer 122, a channel layer 123, a spacer layer 124, a Te-δ-doped layer 125, a barrier layer 126, an i-InAlAs layer 127, and a capping layer 128.

The bottom barrier layer 122 is formed by growing i-AlSb. The channel layer 123 is formed by growing i-InAs. The spacer layer 124 is formed by growing i-AlSb. The Te-δ-doped layer 125 is formed by doping a very thin layer with Te. The barrier layer 126 is formed by growing i-AlSb. The i-InAlAs layer 127 is formed by growing, for example, i-$In_{0.5}Al_{0.5}As$. The capping layer 128 is formed by growing n-InAs.

A source electrode 31 and a drain electrode 32 are formed on the capping layer 128, and a gate electrode 33 is formed on the i-InAlAs layer 127. A tapered groove 30 is formed between the source electrode 31 and the gate electrode 33 such that it becomes gradually deeper toward the source electrode 31. The tapered groove 30 is formed, at its deepest point, to a depth within the barrier layer 126.

This modification provides a reliable AlSb/InAs HEMT with reduced source resistance and thus improved operating speed.

Fourth Modification

A fourth modification discloses an InAlSb/InSb HEMT.

Figure 21:
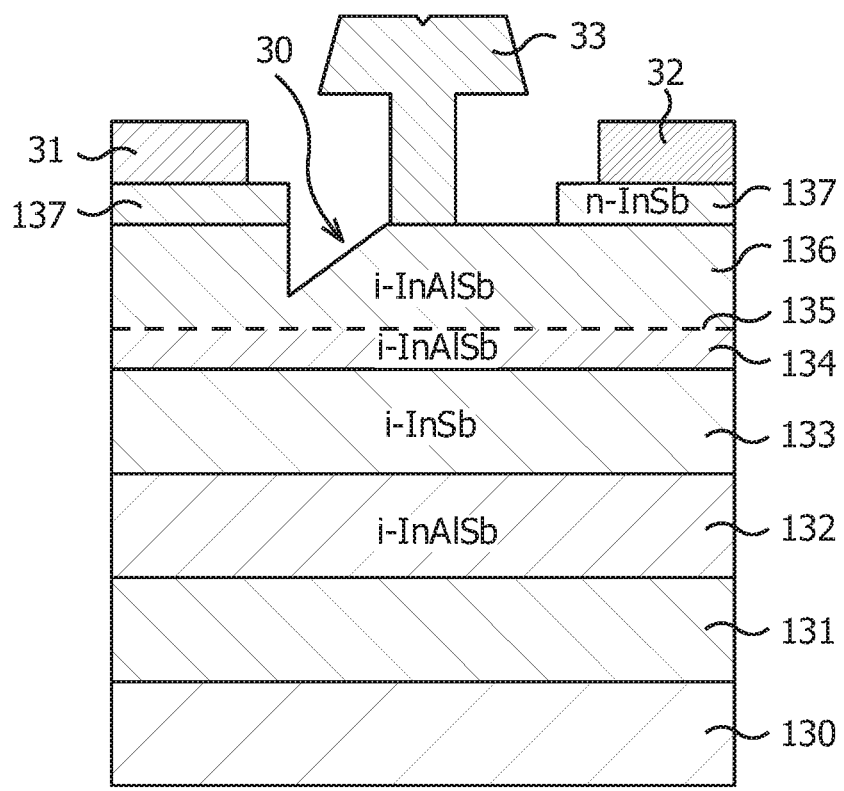
FIG. 21 is a schematic sectional view depicting an InAlSb/InSb HEMT according to a fourth modification of the first embodiment.

FIG. 21 is a schematic sectional view depicting the InAlSb/InSb HEMT according to the fourth modification.

This InAlSb/InSb HEMT includes a substrate 130 on which are formed in sequence a buffer layer 131, a bottom barrier layer 132, a channel layer 133, a spacer layer 134, a Te-δ-doped layer 135, a barrier layer 136, and a capping layer 137.

The bottom barrier layer 132 is formed by growing i-InAlSb. The channel layer 133 is formed by growing i-InSb. The spacer layer 134 is formed by growing i-InAlSb (for example, i-$In_{0.75}Al_{0.25}Sb$). The Te-δ-doped layer 135 is formed by doping a very thin layer with Te. The barrier layer 136 is formed by growing i-InAlSb (for example, i-$In_{0.75}Al_{0.25}Sb$). The capping layer 137 is formed by growing n-InSb.

A source electrode 31 and a drain electrode 32 are formed on the capping layer 137, and a gate electrode 33 is formed on the barrier layer 136. A tapered groove 30 is formed between the source electrode 31 and the gate electrode 33 such that it becomes gradually deeper toward the source electrode 31. The tapered groove 30 is formed, at its deepest point, to a depth within the barrier layer 136.

This modification provides a reliable InAlSb/InSb HEMT with reduced source resistance and thus improved operating speed.

Fifth Modification

A fifth modification discloses an AlGaN/GaN HEMT.

Figure 22:
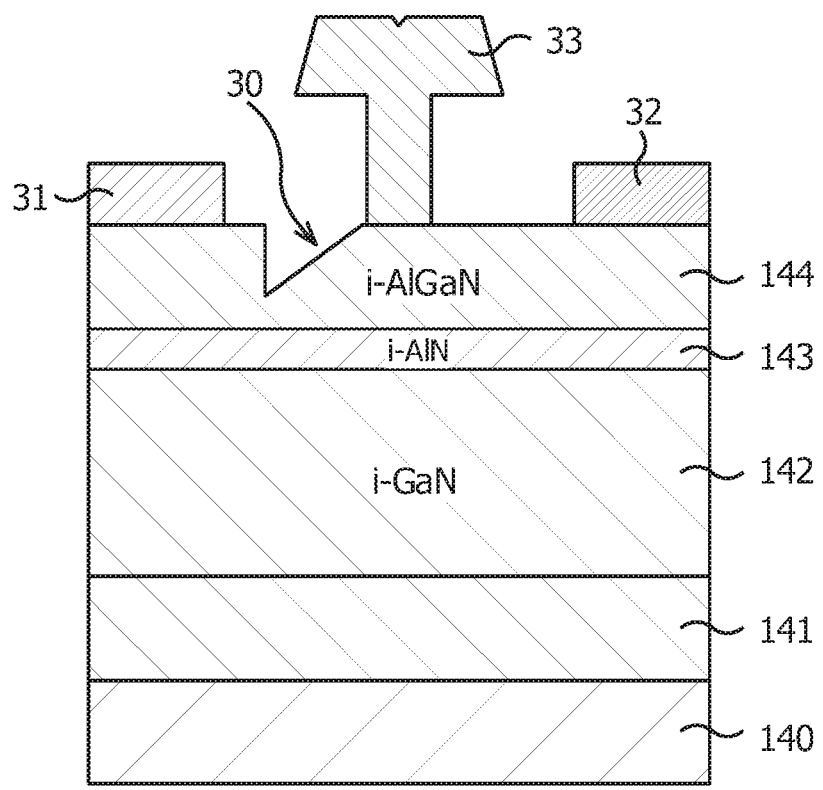
FIG. 22 is a schematic sectional view depicting an AlGaN/GaN HEMT according to a fifth modification of the first embodiment.

FIG. 22 is a schematic sectional view depicting the AlGaN/GaN HEMT according to the fifth modification.

This AlGaN/GaN HEMT includes a substrate 140 on which are formed in sequence a buffer layer 141, a channel layer 142, a spacer layer 143, and a barrier layer 144.

The channel layer 142 is formed by growing i-GaN. The spacer layer 143 is formed by growing i-AlN. The barrier layer 144 is formed by growing i-AlGaN (for example, i-$Al_{0.3}Ga_{0.7}N$).

A source electrode 31 and a drain electrode 32 are formed on the barrier layer 144, and a gate electrode 33 is formed therebetween. A tapered groove 30 is formed between the source electrode 31 and the gate electrode 33 such that it becomes gradually deeper toward the source electrode 31. The tapered groove 30 is formed, at its deepest point, to a depth within the barrier layer 144.

This modification provides a reliable AlGaN/GaN HEMT with reduced source resistance and thus improved operating speed.

Sixth Modification

A sixth modification discloses an InAlN/GaN HEMT.

Figure 23:
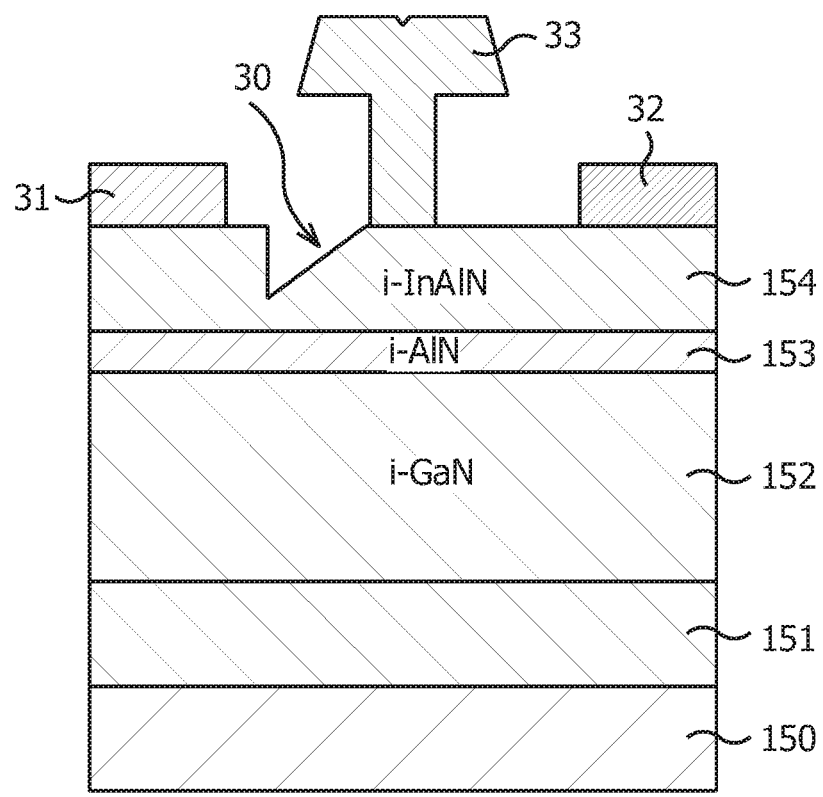
FIG. 23 is a schematic sectional view depicting an InAlN/GaN HEMT according to a sixth modification of the first embodiment.

FIG. 23 is a schematic sectional view depicting the InAlN/GaN HEMT according to the sixth modification.

This InAlN/GaN HEMT includes a substrate 150 on which are formed in sequence a buffer layer 151, a channel layer 152, a spacer layer 153, and a barrier layer 154.

The channel layer 152 is formed by growing i-GaN. The spacer layer 153 is formed by growing i-AlN. The barrier layer 154 is formed by growing i-InAlN.

A source electrode 31 and a drain electrode 32 are formed on the barrier layer 154, and a gate electrode 33 is formed therebetween. A tapered groove 30 is formed between the source electrode 31 and the gate electrode 33 such that it becomes gradually deeper toward the source electrode 31. The tapered groove 30 is formed, at its deepest point, to a depth within the barrier layer 154.

This modification provides a reliable InAlN/GaN HEMT with reduced source resistance and thus improved operating speed.

Seventh Modification

A seventh modification discloses a SiGe/Si HEMT.

Figure 24:
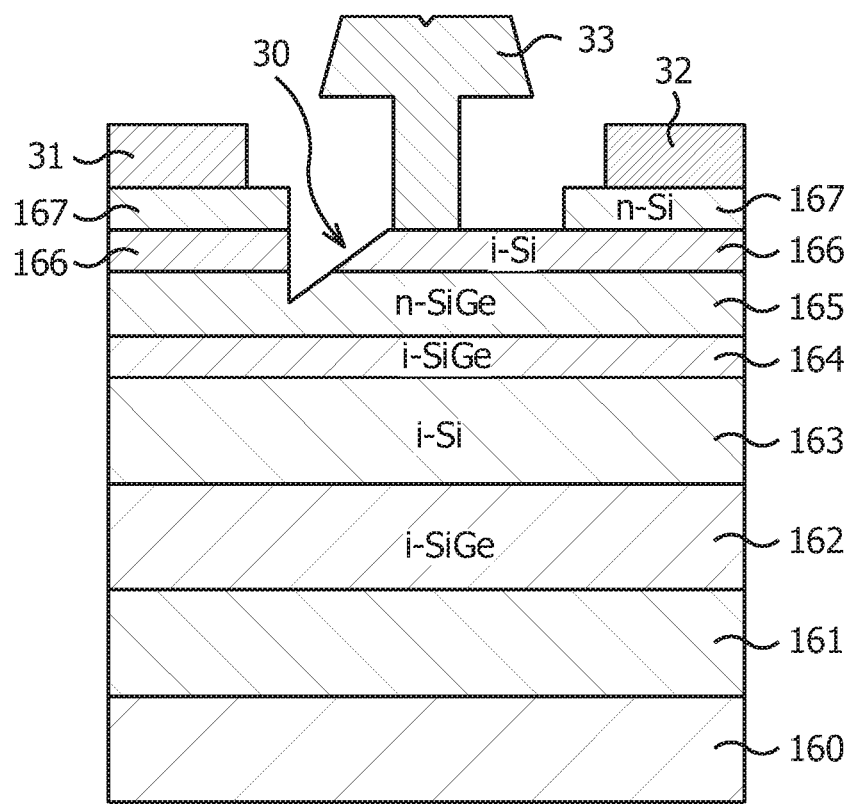
FIG. 24 is a schematic sectional view depicting a SiGe/Si HEMT according to a seventh modification of the first embodiment.

FIG. 24 is a schematic sectional view depicting the SiGe/Si HEMT according to the seventh modification.

This SiGe/Si HEMT includes a substrate 160 on which are formed in sequence a buffer layer 161, a bottom barrier layer 162, a channel layer 163, a spacer layer 164, a barrier layer 165, an i-Si layer 166, and a capping layer 167.

The bottom barrier layer 162 is formed of i-SiGe. The channel layer 163 is formed of i-Si. The spacer layer 164 is formed of i-SiGe. The barrier layer 165 is formed of n-SiGe. The capping layer 167 is formed of n-Si.

A source electrode 31 and a drain electrode 32 are formed on the capping layer 167, and a gate electrode 33 is formed on the i-Si layer 166. A tapered groove 30 is formed between the source electrode 31 and the gate electrode 33 such that it becomes gradually deeper toward the source electrode 31. The tapered groove 30 is formed, at its deepest point, to a depth within the barrier layer 165.

This modification provides a reliable SiGe/Si HEMT with reduced source resistance and thus improved operating speed.

Second Embodiment

As in the first embodiment, a second embodiment discloses an InAlAs/InGaAs HEMT. The second embodiment differs from the first embodiment in that a tapered groove (stepped groove) is formed at a slightly different position.

FIGS. 25A to 31 are schematic sectional views illustrating the main steps of a method for manufacturing an InAlAs/InGaAs HEMT according to the second embodiment.

As in the first embodiment, the steps in FIGS. 1A to 4B are first performed.

Figure 25A:
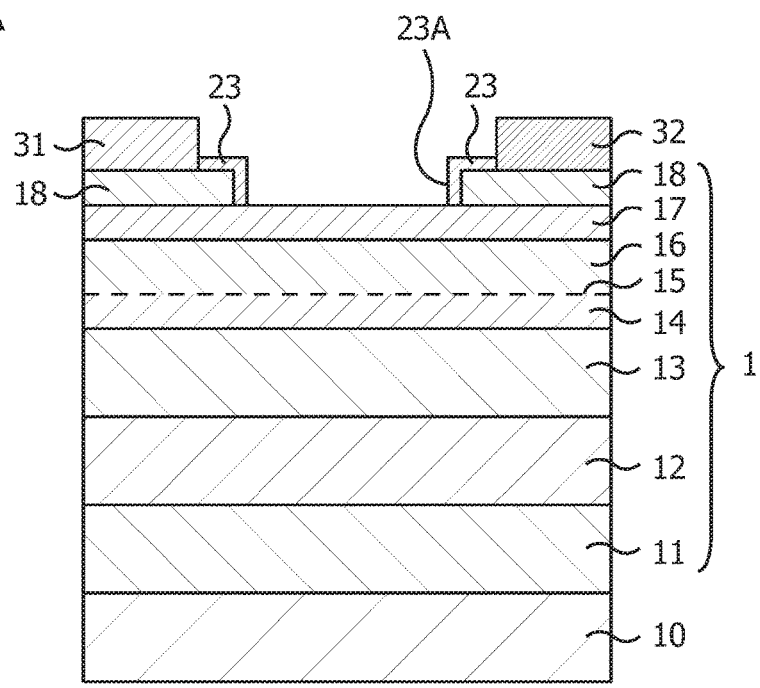
FIG. 25A is a schematic sectional view illustrating a main step of a method for manufacturing an InAlAs/InGaAs HEMT according to a second embodiment.

As depicted in FIG. 25A, an opening 23A is then formed in the $SiO_2$ film 23.

Specifically, a resist is first applied to the $SiO_2$ film 23 and is subjected to a process such as electron beam exposure to form an opening in the resist.

The opening 23A is then formed in the $SiO_2$ film 23 by reactive ion etching using the resist as a mask. The etching gas is, for example, $CF_4$. The opening 23A extends across the region between the source electrode 31 and the drain electrode 32 and has a length of, for example, about 180 nm.

The resist is then removed by chemical treatment or ashing.

Figure 25B:
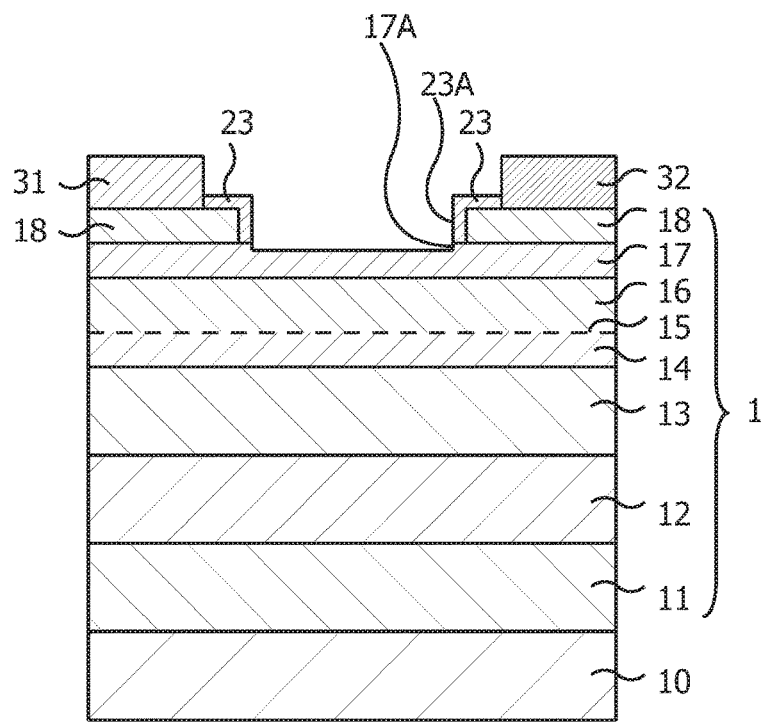
FIG. 25B is a schematic sectional view illustrating a main step, following the step in FIG. 25A, of the method for manufacturing the InAlAs/InGaAs HEMT according to the second embodiment.

As depicted in FIG. 25B, a groove 17A is then formed in the i-InP layer 17.

Specifically, the i-InP layer 17 is wet-etched to a depth of about 1 to 2 nm to form the groove 17A. The etchant is, for example, a solution containing citric acid ($C_6H_8O_7$) and hydrogen peroxide ($H_2O_2$).

Figure 26A:
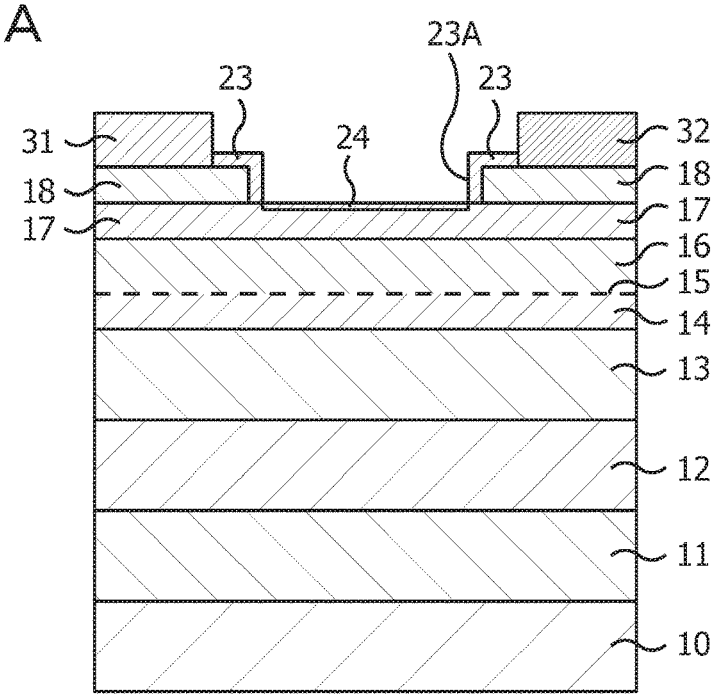
FIG. 26A is a schematic sectional view illustrating a main step, following the step in FIG. 25B, of the method for manufacturing the InAlAs/InGaAs HEMT according to the second embodiment.

As depicted in FIG. 26A, a $SiO_2$ film 24 is then formed in the groove 17A.

Specifically, an insulator, which is $SiO_2$ in this example, is deposited in the groove 17A by a process such as plasma-enhanced CVD. Thus, the $SiO_2$ film 24 is formed.

Figure 26B:
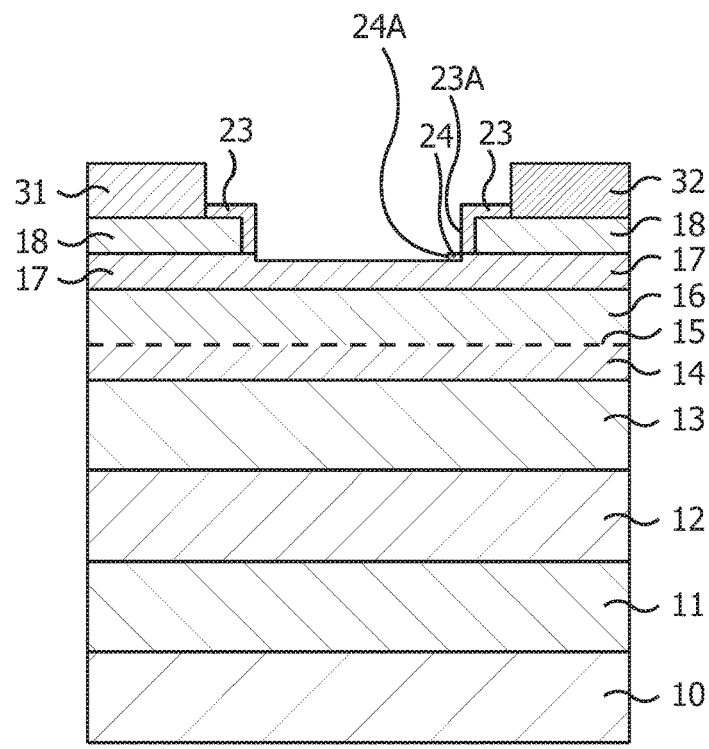
FIG. 26B is a schematic sectional view illustrating a main step, following the step in FIG. 26A, of the method for manufacturing the InAlAs/InGaAs HEMT according to the second embodiment.

As depicted in FIG. 26B, an opening 24A is then formed in the $SiO_2$ film 24.

Specifically, a resist is first applied to the $SiO_2$ film 24 and is subjected to a process such as electron beam exposure to form an opening in the resist.

The opening 24A is then formed in the $SiO_2$ film 24 by reactive ion etching using the resist as a mask. The etching gas is, for example, $CF_4$. The opening 24A is shorter than the opening 23A and has a length of, for example, about 170 nm. The end of the opening 24A closer to the source electrode 31 is aligned with the end of the opening 23A closer to the source electrode 31.

The resist is then removed by chemical treatment or ashing.

Figure 27A:
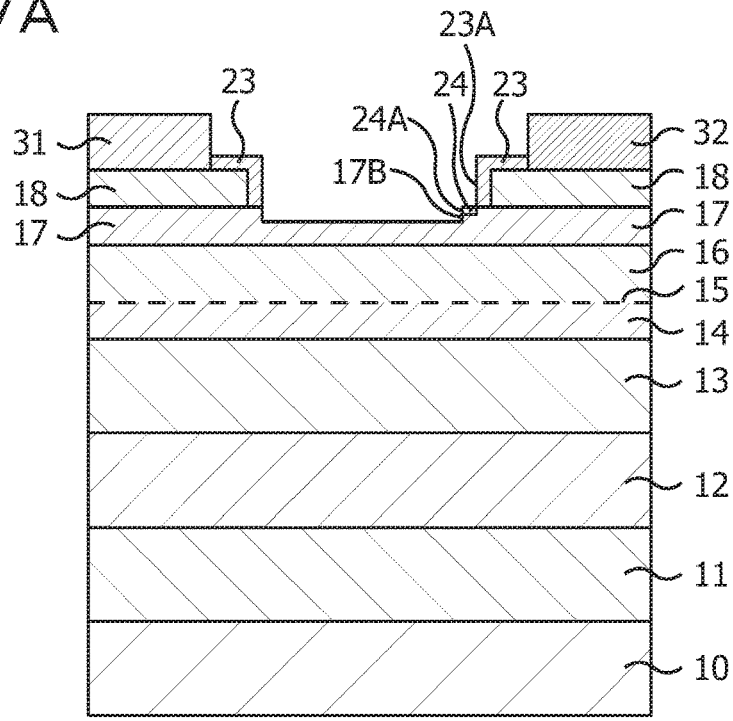
FIG. 27A is a schematic sectional view illustrating a main step, following the step in FIG. 26B, of the method for manufacturing the InAlAs/InGaAs HEMT according to the second embodiment.

As depicted in FIG. 27A, a groove 17B is then formed in the i-InP layer 17.

Specifically, the i-InP layer 17 is wet-etched to a depth of about 1 to 2 nm to form the groove 17B. The groove 17B is deeper than the remaining groove 17A by about 1 to 2 nm; therefore, a step is formed between the grooves 17A and 17B. The etchant is, for example, a solution containing citric acid ($C_6H_8O_7$) and hydrogen peroxide ($H_2O_2$).

Figure 27B:
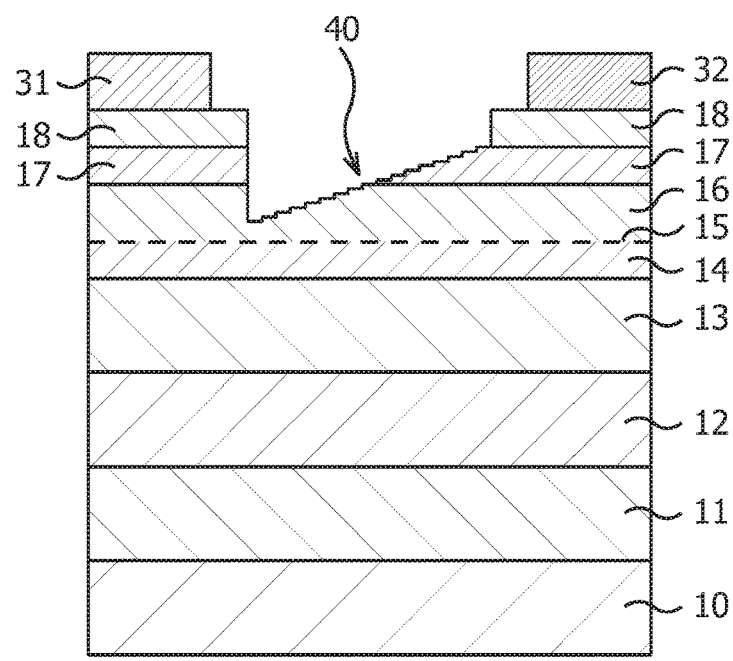
FIG. 27B is a schematic sectional view illustrating a main step, following the step in FIG. 27A, of the method for manufacturing the InAlAs/InGaAs HEMT according to the second embodiment.

As depicted in FIG. 27B, a stepped groove 40 is then formed.

Specifically, grooves are formed by repeating the steps in FIGS. 26A to 27A. Thus, the stepped groove 40 is formed in the compound semiconductor multilayer structure 1 in the region from near the source electrode 31 to near the drain electrode 32. The stepped groove 40 is formed, at its deepest point, to a depth within the barrier layer 16 between the source electrode 31 and the drain electrode 32 such that it becomes stepwise deeper toward the source electrode 31.

Figure 28A:
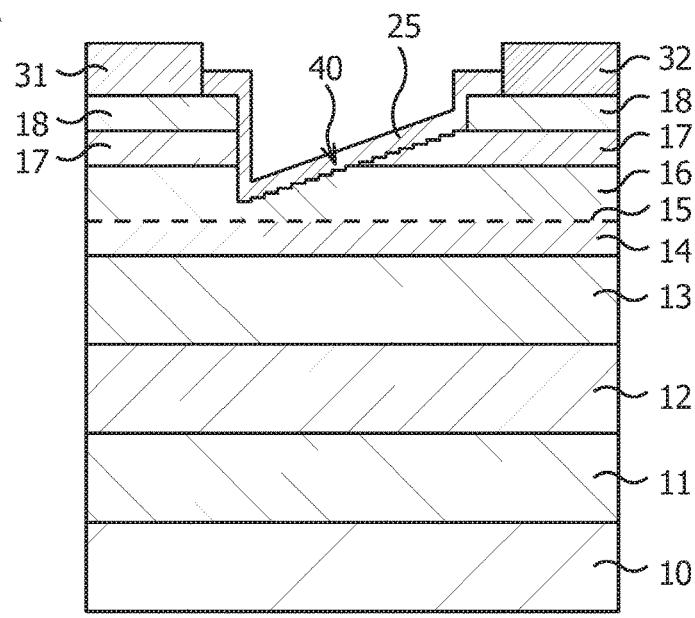
FIG. 28A is a schematic sectional view illustrating a main step, following the step in FIG. 27B, of the method for manufacturing the InAlAs/InGaAs HEMT according to the second embodiment.

As depicted in FIG. 28A, the $SiO_2$ film 25 is then formed.

Specifically, an insulator, which is $SiO_2$ in this example, is deposited between the source electrode 31 and the drain electrode 32 on the compound semiconductor multilayer structure 1 by a process such as plasma-enhanced CVD to cover the stepped groove 40. Thus, the $SiO_2$ film 25 is formed.

Figure 28B:
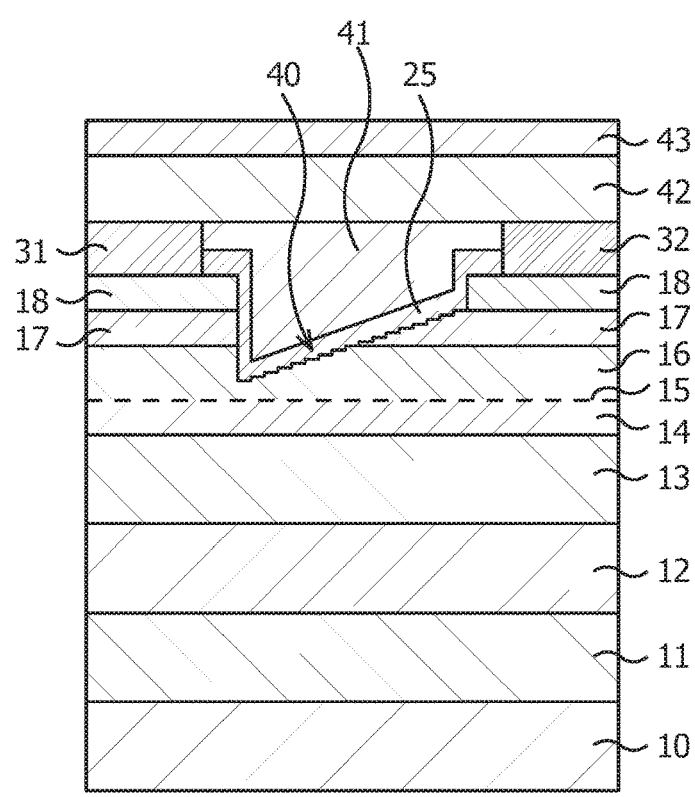
FIG. 28B is a schematic sectional view illustrating a main step, following the step in FIG. 28A, of the method for manufacturing the InAlAs/InGaAs HEMT according to the second embodiment.

As depicted in FIG. 28B, three resist films 41 to 43 are then formed on top of each other.

Specifically, for example, a ZEP resist available from Zeon Corporation, a PMGI resist, and a ZEP resist are applied in sequence to cover the compound semiconductor multilayer structure 1. Thus, the resist films 41 to 43 are formed.

Figure 29A:
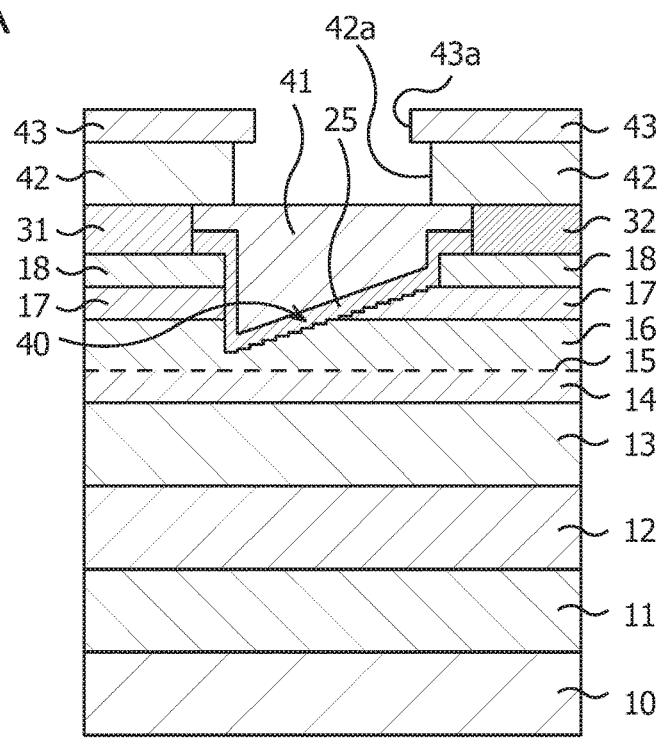
FIG. 29A is a schematic sectional view illustrating a main step, following the step in FIG. 28B, of the method for manufacturing the InAlAs/InGaAs HEMT according to the second embodiment.

As depicted in FIG. 29A, openings 42a and 43a are then formed in the resist films 42 and 43, respectively.

Specifically, the resist films 42 and 43 are exposed in the areas where the head of the T-gate is to be formed by a process such as electron beam exposure to form the openings 42a and 43a in the resist films 42 and 43, respectively.

Figure 29B:
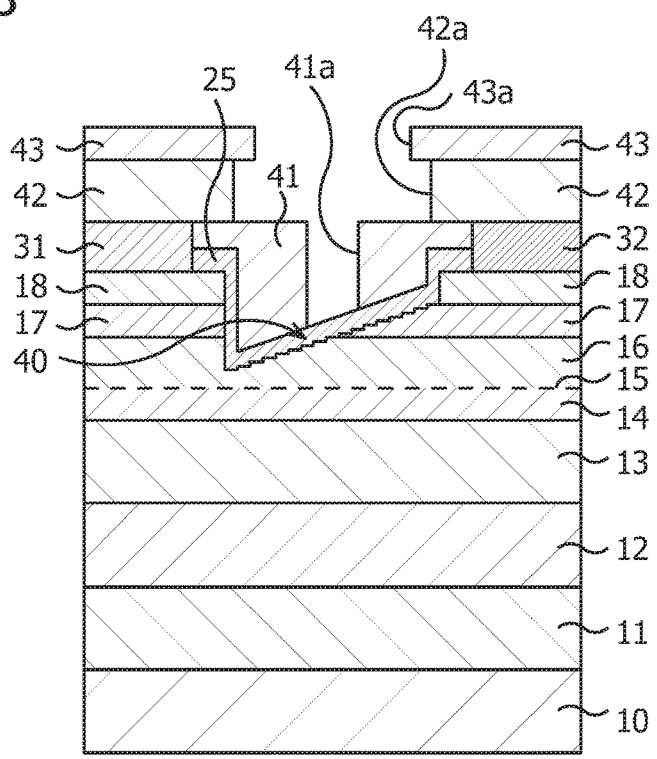
FIG. 29B is a schematic sectional view illustrating a main step, following the step in FIG. 29A, of the method for manufacturing the InAlAs/InGaAs HEMT according to the second embodiment.

As depicted in FIG. 29B, an opening 41a is then formed in the resist film 41.

Specifically, the resist film 41 is exposed in the area where the foot of the T-gate is to be formed by a process such as electron beam exposure depending on the target gate length to form the opening 41a in the resist film 41.

Figure 30A:
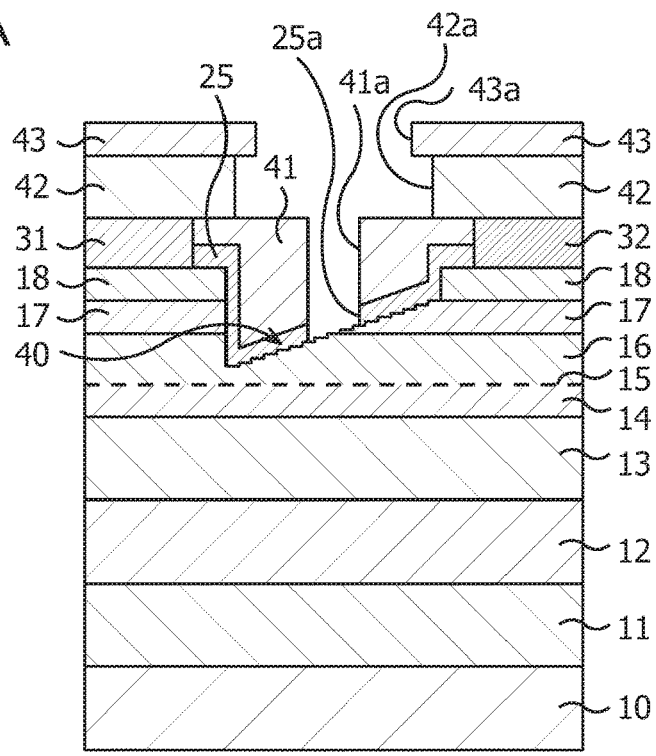
FIG. 30A is a schematic sectional view illustrating a main step, following the step in FIG. 29B, of the method for manufacturing the InAlAs/InGaAs HEMT according to the second embodiment.

As depicted in FIG. 30A, an opening 25a is then formed in the $SiO_2$ film 25.

Specifically, the opening 25a is formed in the $SiO_2$ film 25 by reactive ion etching using the resist film 41 as a mask. The etching gas is, for example, $CF_4$.

Figure 30B:
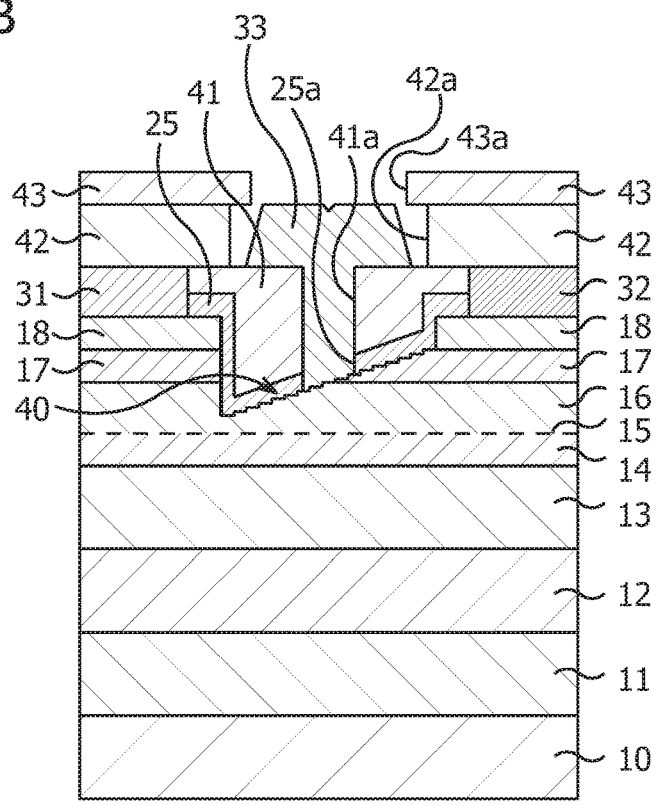
FIG. 30B is a schematic sectional view illustrating a main step, following the step in FIG. 30A, of the method for manufacturing the InAlAs/InGaAs HEMT according to the second embodiment.
Figure 31:
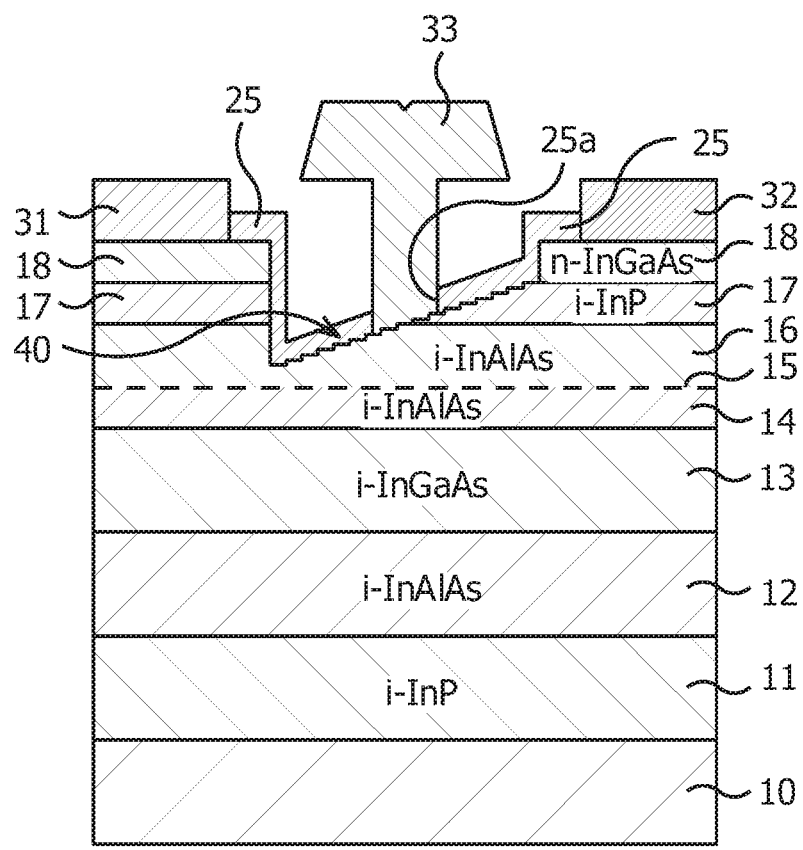
FIG. 31 is a schematic sectional view illustrating a main step, following the step in FIG. 30B, of the method for manufacturing the InAlAs/InGaAs HEMT according to the second embodiment.

As depicted in FIGS. 30B and 31, a gate electrode 33 is then formed.

Specifically, electrode materials, for example, titanium, platinum, and gold, are deposited over the resist film 43, including the openings 41a to 43a, by a process such as evaporation using the resist films 41 to 43 as a mask. Titanium is deposited to a thickness of about 10 nm. Platinum is deposited to a thickness of about 5 nm. Gold is deposited to a thickness of about 400 nm. The resist films 41 to 43 and the titanium, platinum, and gold deposited thereon are then removed by a lift-off process. Thus, as depicted in FIG. 31, the T-gate electrode 33 is formed on the bottom surface of the stepped groove 40.

In this way, the InAlAs/InGaAs HEMT according to this embodiment is fabricated.

This embodiment illustrates the fabrication of a Schottky InAlAs/InGaAs HEMT in which the gate electrode 33 directly contacts the bottom surface of the stepped groove 40 in the compound semiconductor multilayer structure 1. Instead of a Schottky InAlAs/InGaAs HEMT, a MIS InAlAs/InGaAs HEMT may be fabricated in which the gate electrode 33 is formed above the compound semiconductor multilayer structure 1 with a gate insulator therebetween. This may be done by skipping the step in FIG. 30A, in which the opening 25a is formed in the SiO$_2$ film 25, that is, by performing the step in FIG. 29B and then performing the step in FIG. 30B and the subsequent steps.

Figure 32:
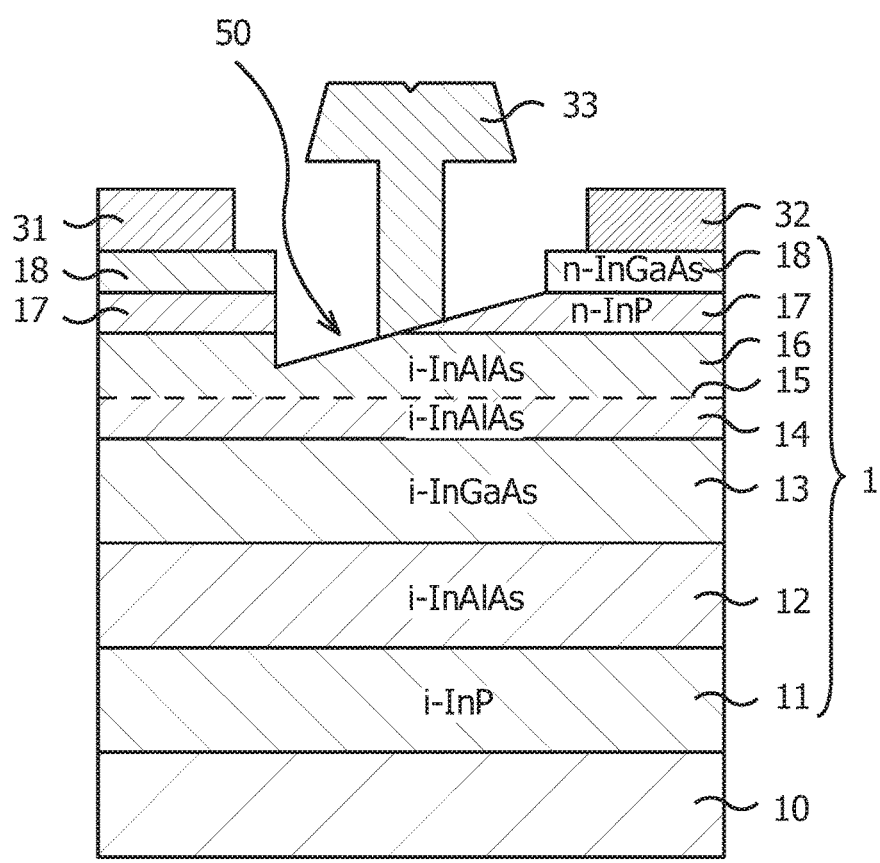
FIG. 32 is a schematic sectional view illustrating, in outline, an InAlAs/InGaAs HEMT having a tapered groove according to the second embodiment.

As illustrated in FIG. 31, the InAlAs/InGaAs HEMT according to this embodiment has the stepped groove 40 that becomes stepwise deeper toward the source electrode 31 between the source electrode 31 and the drain electrode 32. As the step height of the stepped groove 40 is reduced, it may eventually be considered as a continuous inclined groove. In practice, the minimum possible step height is equivalent to one monoatomic layer of the compound semiconductor. FIG. 32 depicts an InAlAs/InGaAs HEMT according to this embodiment in which an inclined groove that may be considered as being continuous, namely, a tapered groove 50 that becomes gradually deeper toward the source electrode 31, is formed between the source electrode 31 and the drain electrode 32. The SiO$_2$ film 25 is not depicted in FIG. 32. The InAlAs/InGaAs HEMT according to this embodiment in which the tapered groove 50 is formed and its advantages will now be described.

Figure 33:
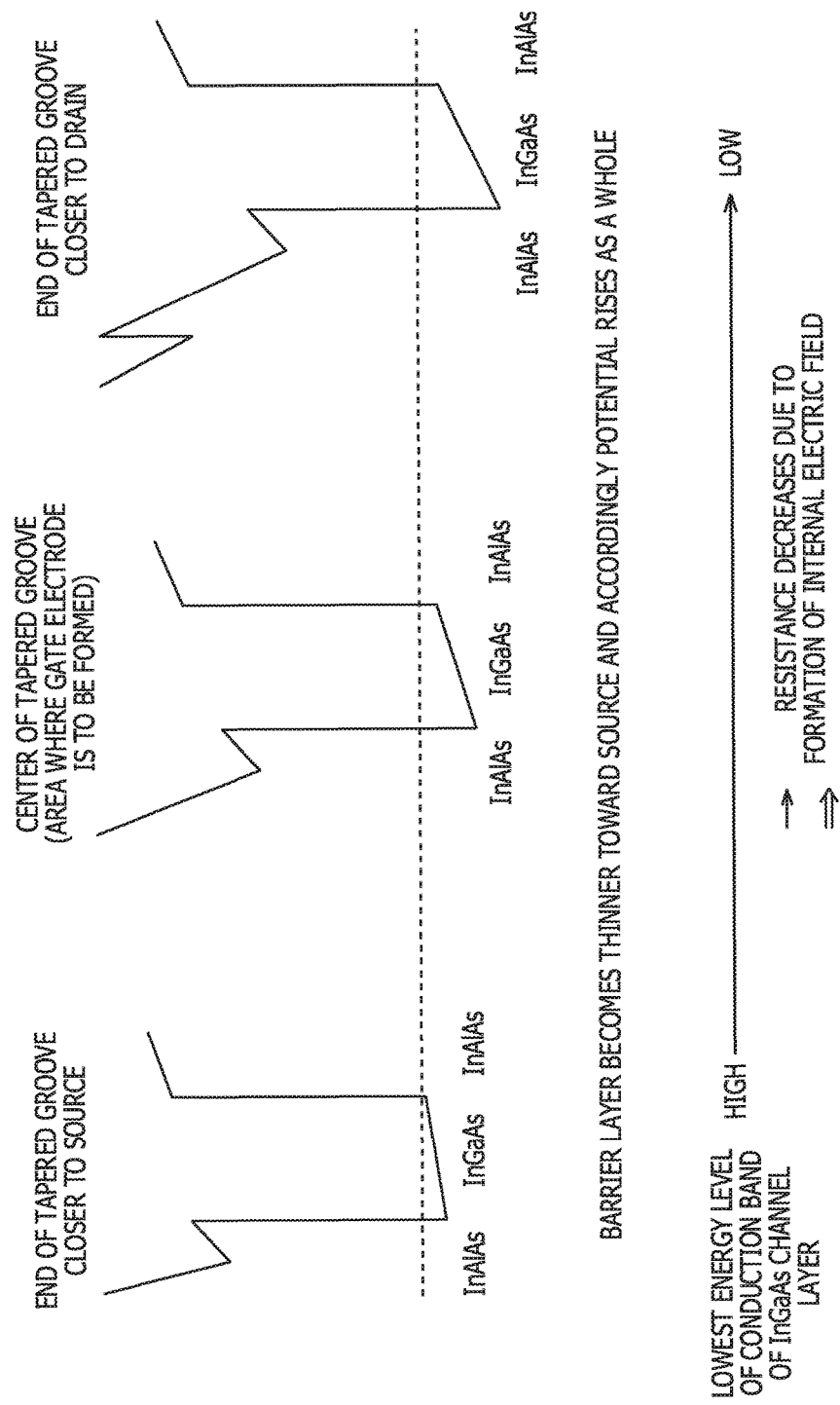
FIG. 33 is a schematic diagram depicting the conduction band structures, in the perpendicular direction, at the end of the tapered groove closer to a source electrode, the center of the tapered groove (the area where a gate electrode is to be formed), and the end of the tapered groove closer to a drain electrode in the second embodiment.

FIG. 33 is a schematic diagram depicting the conduction band structures, in the perpendicular direction, at the end of the tapered groove 50 closer to the source electrode 31, the center of the tapered groove 50 (the area where the gate electrode 33 is to be formed), and the end of the tapered groove 50 closer to the drain electrode 32. As illustrated in FIG. 33, the lowest energy level of the conduction band of the channel layer 13 decreases from near the source electrode 31 toward the drain electrode 32, thus forming an internal electric field between the source electrode 31 and the drain electrode 32. This is because the barrier layer 16 becomes thinner toward the source electrode 31 and accordingly the potential rises as a whole. This diagram depicts the band structure before the formation of the gate electrode 33; after the formation of the gate electrode 33, an internal electric field is formed across the tapered groove 30 both between the source electrode 31 and the gate electrode 33 and between the gate electrode 33 and the drain electrode 32. However, a greater effect is achieved between the source electrode 31 and the gate electrode 33 because of the great influence of the recess length in the transverse direction on the electric field intensity between the gate electrode 33 and the drain electrode 32.

Figure 34:
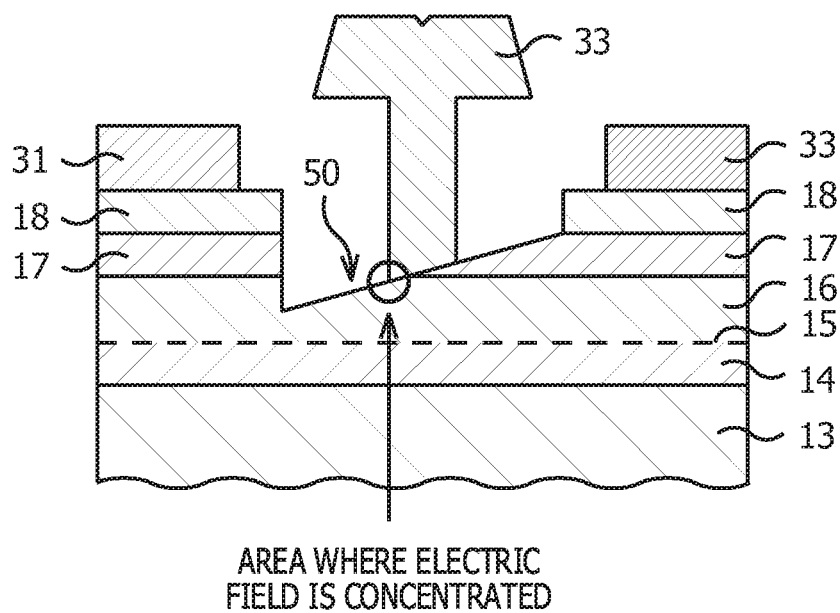
FIG. 34 is a schematic sectional view illustrating a technical feature of the InAlAs/InGaAs HEMT according to the second embodiment.

Additionally, in this embodiment, as depicted in FIG. 34, the gate electrode 33 is formed on the bottom surface of the tapered groove 50. Thus, the foot of the gate electrode 33 has a sharp end (enclosed by the circle in FIG. 34) that conforms to the shape of the tapered groove 50 and that is closer to the channel layer 13 on the source electrode 31 side. This embodiment allows an electric field to be more concentrated at the sharp end than a HEMT having no such structure (HEMT including a gate electrode formed on a flat surface). This reduces the effective gate length and thus reduces the intrinsic delay time $\tau_{int}$.

As described above, the tapered groove 50 that becomes stepwise deeper toward the source electrode 31 is formed in the region between the source electrode 31 and the gate electrode 33, thus forming an internal electric field in that region. This enhances the acceleration of electrons between the source electrode 31 and the gate electrode 33 as compared to the comparative example. The drain current $I_{ds}$ is expressed as follows:

$$I_{ds} = nev$$

where n is the electron density, e is the unit charge, and v is the electron velocity. The electron densities n in this embodiment and the comparative example are almost equal since electrons are similarly supplied from an n-type ohmic contact. The electron velocity v, in contrast, is increased by the internal electric field. This increases the drain current and thus decreases the source resistance as compared to the comparative example.

Additionally, in this embodiment, the bottom surface of the gate electrode 33 is formed on the bottom surface of the tapered groove 50. This reduces the effective gate length and thus reduces the intrinsic delay time $\tau_{int}$.

The InAlAs/InGaAs HEMT according to this embodiment has both reduced intrinsic delay time $\tau_{int}$ and reduced extrinsic (parasitic) delay time $\tau_{ext}$.

As described above, this embodiment provides a reliable InAlAs/InGaAs HEMT with reduced source resistance and thus improved operating speed.

Modifications of Second Embodiment

Various HEMTs according to modifications of this embodiment will now be described.

First Modification

A first modification discloses an AlGaAs/GaAs HEMT.

Figure 35:
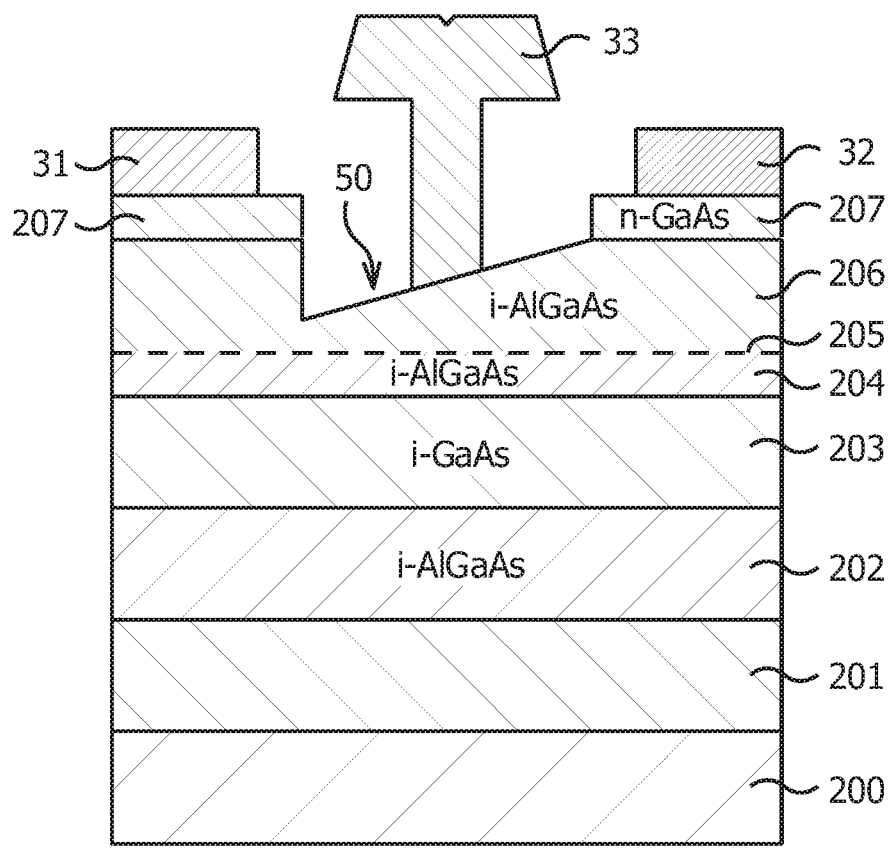
FIG. 35 is a schematic sectional view depicting an AlGaAs/GaAs HEMT according to a first modification of the second embodiment.

FIG. 35 is a schematic sectional view depicting the AlGaAs/GaAs HEMT according to the first modification.

This AlGaAs/GaAs HEMT includes a substrate 200 on which are formed in sequence a buffer layer 201, a bottom barrier layer 202, a channel layer 203, a spacer layer 204, a Si-δ-doped layer 205, a barrier layer 206, and a capping layer 207.

The bottom barrier layer 202 is formed by growing i-AlGaAs (for example, i-Al$_{0.3}$Ga$_{0.7}$As). The channel layer 203 is formed by growing i-GaAs. The spacer layer 204 is formed by growing i-AlGaAs (for example, i-Al$_{0.3}$Ga$_{0.7}$As). The Si-δ-doped layer 205 is formed by doping a very thin layer with Si. The barrier layer 206 is formed by growing i-AlGaAs (for example, i-Al$_{0.3}$Ga$_{0.7}$As). The capping layer 207 is formed by growing n-GaAs.

A source electrode 31 and a drain electrode 32 are formed on the capping layer 207, and a gate electrode 33 is formed on the bottom surface of a tapered groove 50. The tapered groove 50 is formed between the source electrode 31 and the drain electrode 32 such that it becomes gradually deeper toward the source electrode 31. The tapered groove 50 is formed, at its deepest point, to a depth within the barrier layer 206.

This modification provides a reliable AlGaAs/GaAs HEMT with reduced source resistance and thus improved operating speed.

Second Modification

A second modification discloses an AlGaAs/InGaAs HEMT.

Figure 36:
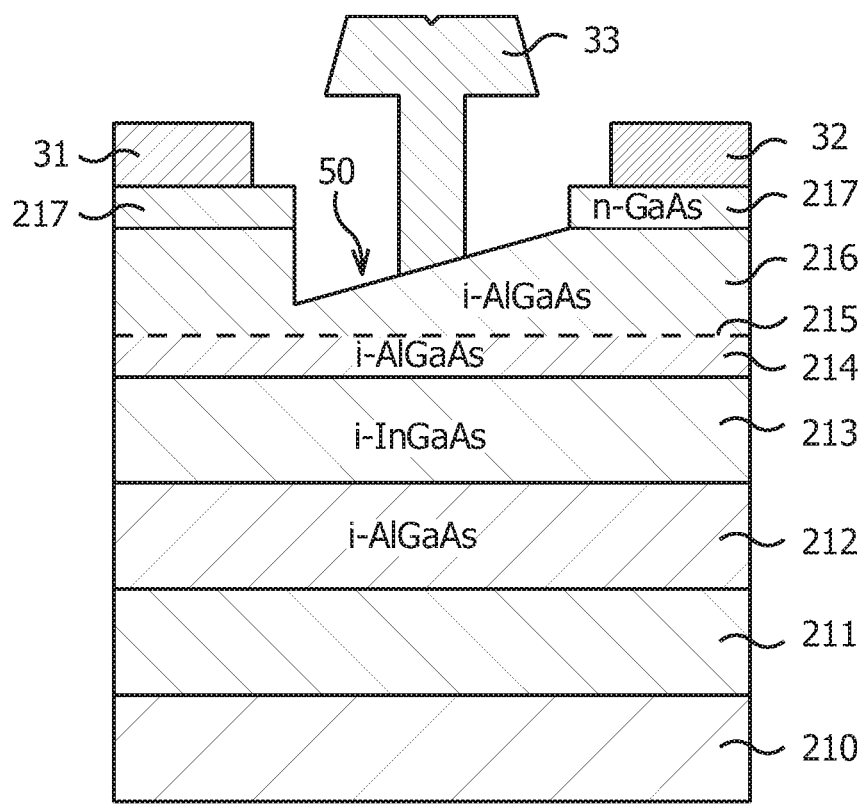
FIG. 36 is a schematic sectional view depicting an AlGaAs/InGaAs HEMT according to a second modification of the second embodiment.

FIG. 36 is a schematic sectional view depicting the AlGaAs/InGaAs HEMT according to the second modification.

This AlGaAs/InGaAs HEMT includes a substrate 210 on which are formed in sequence a buffer layer 211, a bottom barrier layer 212, a channel layer 213, a spacer layer 214, a Si-δ-doped layer 215, a barrier layer 216, and a capping layer 217.

The bottom barrier layer 212 is formed by growing i-AlGaAs (for example, i-$Al_{0.3}Ga_{0.7}As$). The channel layer 213 is formed by growing i-InGaAs. The spacer layer 214 is formed by growing i-AlGaAs (for example, i-$Al_{0.3}Ga_{0.7}As$). The Si-δ-doped layer 215 is formed by doping a very thin layer with Si. The barrier layer 216 is formed by growing i-AlGaAs (for example, i-$Al_{0.3}Ga_{0.7}As$). The capping layer 217 is formed by growing n-GaAs.

A source electrode 31 and a drain electrode 32 are formed on the capping layer 217, and a gate electrode 33 is formed on the bottom surface of a tapered groove 50. The tapered groove 50 is formed between the source electrode 31 and the drain electrode 32 such that it becomes gradually deeper toward the source electrode 31. The tapered groove 50 is formed, at its deepest point, to a depth within the barrier layer 216.

This modification provides a reliable AlGaAs/InGaAs HEMT with reduced source resistance and thus improved operating speed.

Third Modification

A third modification discloses an AlSb/InAs HEMT.

Figure 37:
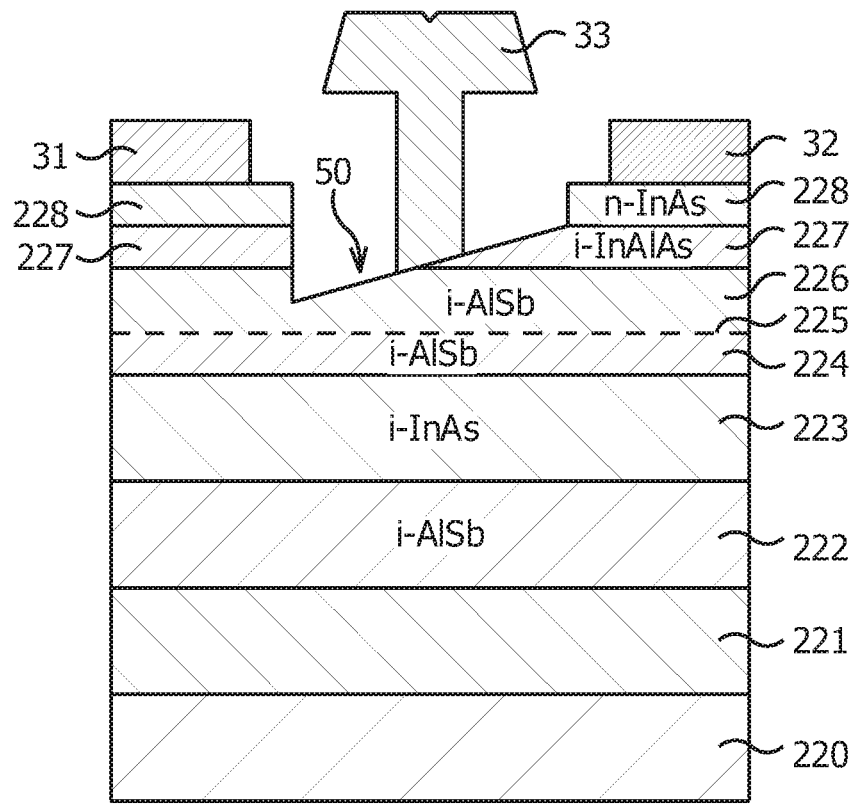
FIG. 37 is a schematic sectional view depicting an AlSb/InAs HEMT according to a third modification of the second embodiment.

FIG. 37 is a schematic sectional view depicting the AlSb/InAs HEMT according to the third modification.

This AlSb/InAs HEMT includes a substrate 220 on which are formed in sequence a buffer layer 221, a bottom barrier layer 222, a channel layer 223, a spacer layer 224, a Te-δ-doped layer 225, a barrier layer 226, an i-InAlAs layer 227, and a capping layer 228.

The bottom barrier layer 222 is formed by growing i-AlSb. The channel layer 223 is formed by growing i-InAs. The spacer layer 224 is formed by growing i-AlSb. The Te-δ-doped layer 225 is formed by doping a very thin layer with Te. The barrier layer 226 is formed by growing i-AlSb. The i-InAlAs layer 227 is formed by growing, for example, i-$In_{0.5}Al_{0.5}As$. The capping layer 228 is formed by growing n-InAs.

A source electrode 31 and a drain electrode 32 are formed on the capping layer 228, and a gate electrode 33 is formed on the bottom surface of a tapered groove 50. The tapered groove 50 is formed between the source electrode 31 and the drain electrode 32 such that it becomes gradually deeper toward the source electrode 31. The tapered groove 50 is formed, at its deepest point, to a depth within the barrier layer 226.

This modification provides a reliable AlSb/InAs HEMT with reduced source resistance and thus improved operating speed.

Fourth Modification

A fourth modification discloses an InAlSb/InSb HEMT.

Figure 38:
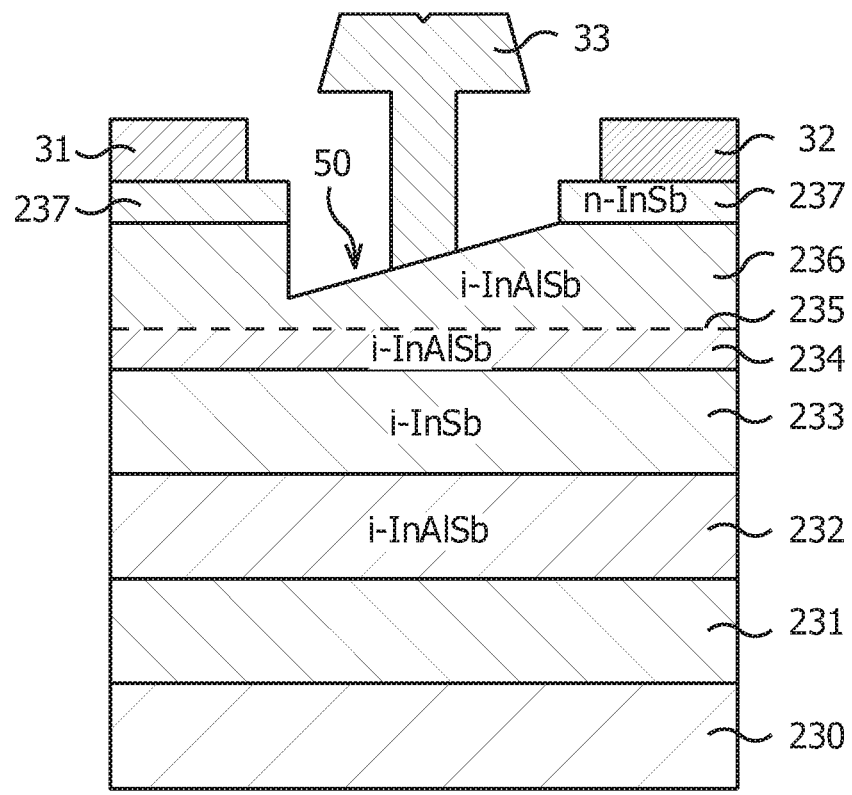
FIG. 38 is a schematic sectional view depicting an InAlSb/InSb HEMT according to a fourth modification of the second embodiment.

FIG. 38 is a schematic sectional view depicting the InAlSb/InSb HEMT according to the fourth modification.

This InAlSb/InSb HEMT includes a substrate 230 on which are formed in sequence a buffer layer 231, a bottom barrier layer 232, a channel layer 233, a spacer layer 234, a Te-δ-doped layer 235, a barrier layer 236, and a capping layer 237.

The bottom barrier layer 232 is formed by growing i-InAlSb. The channel layer 233 is formed by growing i-InSb. The spacer layer 234 is formed by growing i-InAlSb (for example, i-$In_{0.75}Al_{0.25}Sb$). The Te-δ-doped layer 235 is formed by doping a very thin layer with Te. The barrier layer 236 is formed by growing i-InAlSb (for example, i-$In_{0.75}Al_{0.25}Sb$). The capping layer 237 is formed by growing n-InSb.

A source electrode 31 and a drain electrode 32 are formed on the capping layer 237, and a gate electrode 33 is formed on the bottom surface of a tapered groove 50. The tapered groove 50 is formed between the source electrode 31 and the drain electrode 32 such that it becomes gradually deeper toward the source electrode 31. The tapered groove 50 is formed, at its deepest point, to a depth within the barrier layer 236.

This modification provides a reliable InAlSb/InSb HEMT with reduced source resistance and thus improved operating speed.

Fifth Modification

A fifth modification discloses an AlGaN/GaN HEMT.

Figure 39:
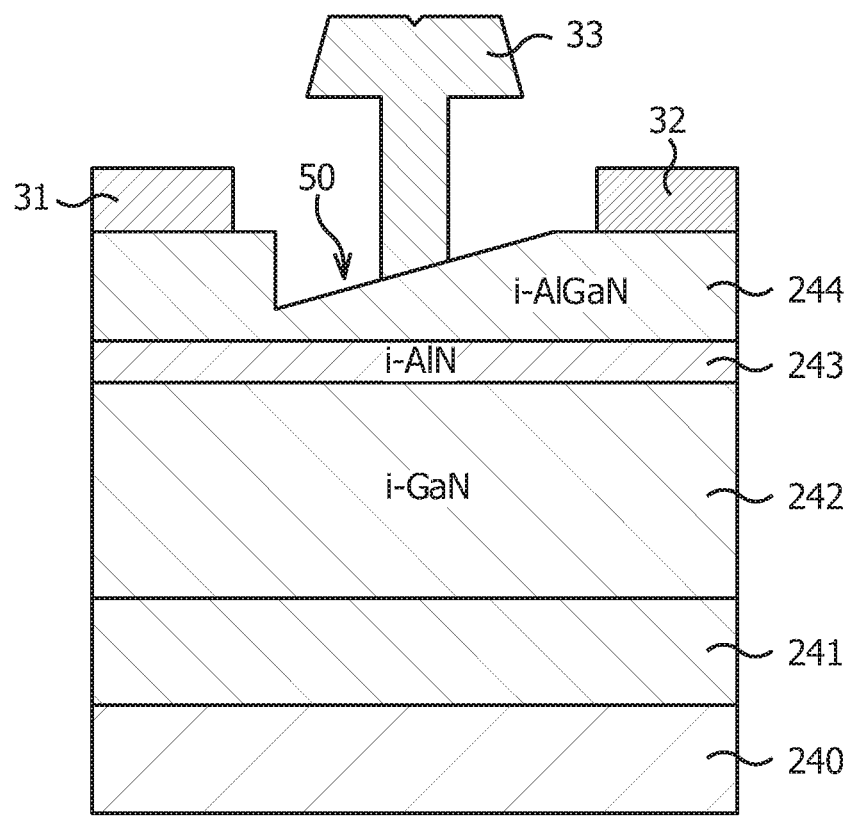
FIG. 39 is a schematic sectional view depicting an AlGaN/GaN HEMT according to a fifth modification of the second embodiment.

FIG. 39 is a schematic sectional view depicting the AlGaN/GaN HEMT according to the fifth modification.

This AlGaN/GaN HEMT includes a substrate 240 on which are formed in sequence a buffer layer 241, a channel layer 242, a spacer layer 243, and a barrier layer 244.

The channel layer 242 is formed by growing i-GaN. The spacer layer 243 is formed by growing i-AlN. The barrier layer 244 is formed by growing i-AlGaN (for example, i-$Al_{0.3}Ga_{0.7}N$).

A source electrode 31 and a drain electrode 32 are formed on the barrier layer 244, and a gate electrode 33 is formed therebetween. The gate electrode 33 is formed on the bottom surface of a tapered groove 50 in the barrier layer 244. The tapered groove 50 is formed between the source electrode 31 and the drain electrode 32 such that it becomes gradually deeper toward the source electrode 31. The tapered groove 50 is formed, at its deepest point, to a depth within the barrier layer 244.

This modification provides a reliable AlGaN/GaN HEMT with reduced source resistance and thus improved operating speed.

Sixth Modification

A sixth modification discloses an InAlN/GaN HEMT.

Figure 40:
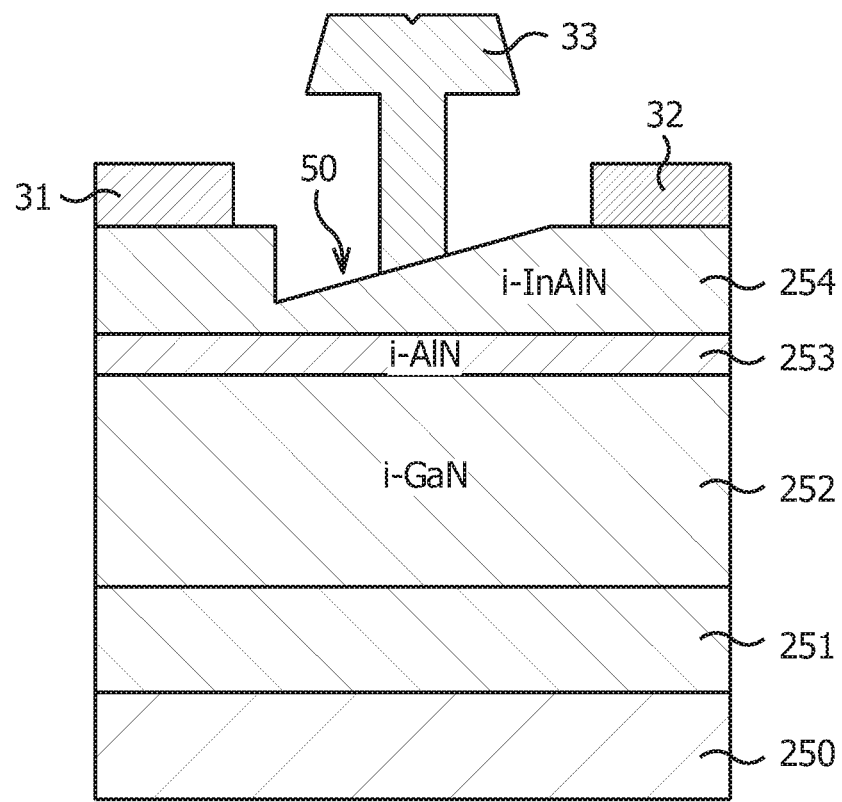
FIG. 40 is a schematic sectional view depicting an InAlN/GaN HEMT according to a sixth modification of the second embodiment.

FIG. 40 is a schematic sectional view depicting the InAlN/GaN HEMT according to the sixth modification.

This InAlN/GaN HEMT includes a substrate 250 on which are formed in sequence a buffer layer 251, a channel layer 252, a spacer layer 253, and a barrier layer 254.

The channel layer 252 is formed by growing i-GaN. The spacer layer 253 is formed by growing i-AlN. The barrier layer 254 is formed by growing i-InAlN.

A source electrode 31 and a drain electrode 32 are formed on the barrier layer 254, and a gate electrode 33 is formed therebetween. The gate electrode 33 is formed on the bottom surface of a tapered groove 50 in the barrier layer 254. The tapered groove 50 is formed between the source electrode 31 and the drain electrode 32 such that it becomes gradually deeper toward the source electrode 31. The tapered groove 50 is formed, at its deepest point, to a depth within the barrier layer 254.

This modification provides a reliable InAlN/GaN HEMT with reduced source resistance and thus improved operating speed.

Seventh Modification

A seventh modification discloses a SiGe/Si HEMT.

Figure 41:
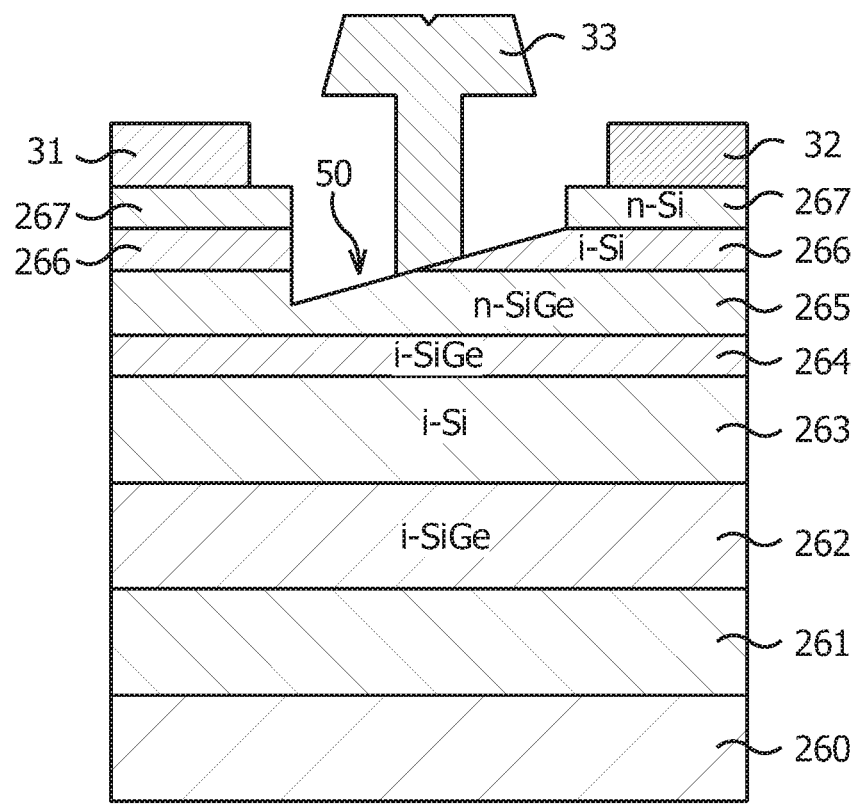
FIG. 41 is a schematic sectional view depicting a SiGe/Si HEMT according to a seventh modification of the second embodiment.

FIG. 41 is a schematic sectional view depicting the SiGe/Si HEMT according to the seventh modification.

This SiGe/Si HEMT includes a substrate 260 on which are formed in sequence a buffer layer 261, a bottom barrier layer 262, a channel layer 263, a spacer layer 264, a barrier layer 265, an i-Si layer 266, and a capping layer 267.

The bottom barrier layer 262 is formed of i-SiGe. The channel layer 263 is formed of i-Si. The spacer layer 264 is formed of i-SiGe. The barrier layer 265 is formed of n-SiGe. The capping layer 267 is formed of n-Si.

A source electrode 31 and a drain electrode 32 are formed on the capping layer 267, and a gate electrode 33 is formed on the bottom surface of a tapered groove 50. The tapered groove 50 is formed between the source electrode 31 and the drain electrode 32 such that it becomes gradually deeper toward the source electrode 31. The tapered groove 50 is formed, at its deepest point, to a depth within the barrier layer 265.

This modification provides a reliable SiGe/Si HEMT with reduced source resistance and thus improved operating speed.

Third Embodiment

A third embodiment discloses a radio-frequency amplifier including one of the HEMTs according to the first and second embodiments and the various modifications thereof.

Figure 42:
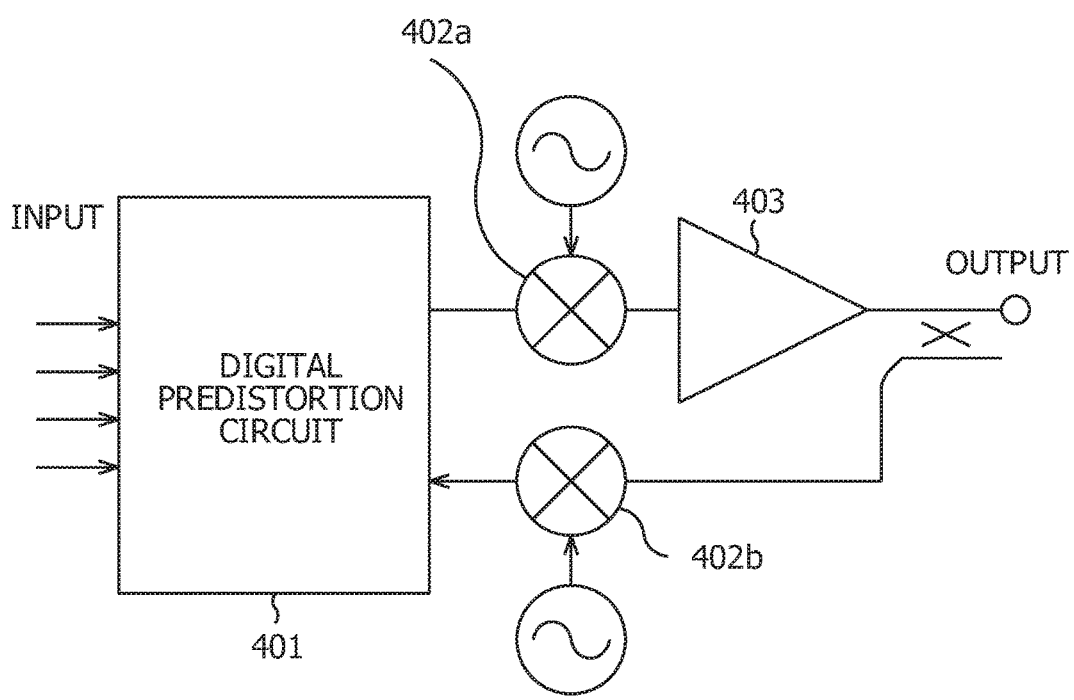
FIG. 42 is a connection diagram depicting, in outline, the configuration of a radio-frequency amplifier according to a third embodiment.

FIG. 42 is a connection diagram depicting, in outline, the configuration of the radio-frequency amplifier according to the third embodiment.

The radio-frequency amplifier according to this embodiment includes a digital predistortion circuit 401, mixers 402a and 402b, and a power amplifier 403.

The digital predistortion circuit 401 compensates for nonlinear distortion in an input signal. The mixer 402a mixes the input signal in which nonlinear distortion has been compensated for with an AC signal. The power amplifier 403 amplifies the input signal mixed with the AC signal. The power amplifier 403 includes one of the HEMTs according to the first and second embodiments and the various modifications thereof. In the configuration in FIG. 42, for example, switching is performed to mix a signal coming from the output with an AC signal by the mixer 402b and then supply it to the digital predistortion circuit 401.

In this embodiment, a HEMT with reduced source resistance and thus improved operating speed is applied to a radio-frequency amplifier. This provides a reliable radio-frequency amplifier capable of operating at high speed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A compound semiconductor device, comprising:
compound semiconductor layers formed over a substrate;
an electron transit layer formed over the compound semiconductor layers;
a spacer layer formed over the electron transit layer;
an electron supply layer formed over the spacer layer;
a gate electrode disposed over the electron supply layer; and
source and drain electrodes disposed over the electron supply layer with the gate electrode between the source and drain electrodes,
wherein the electron supply layer has a groove in a surface thereof at least between the source electrode and the gate electrode in a region between the source electrode and the drain electrode, the groove gradually deepened toward the source electrode.

2. The compound semiconductor device according to claim 1, wherein
the groove in the electron supply layer extends between the source electrode and the drain electrode.

3. The compound semiconductor device according to claim 1, wherein
the groove in the electron supply layer becomes stepwise deeper toward the source electrode.

4. A radio-frequency amplifier for outputting an amplified input radio-frequency voltage, comprising:
a transistor comprising
compound semiconductor layers formed over a substrate;
an electron transit layer formed over the compound semiconductor layers;
a spacer layer formed over the electron transit layer;
an electron supply layer formed over the spacer layer;
a gate electrode disposed over the electron supply layer; and
source and drain electrodes disposed over the electron supply layer with the gate electrode between the source and drain electrodes,
wherein the electron supply layer has a groove in a surface thereof at least between the source electrode and the gate electrode in a region between the source electrode and the drain electrode, the groove gradually deepened toward the source electrode.

* * * * *